(12) United States Patent
Kobayashi et al.

(10) Patent No.: US 8,399,288 B2
(45) Date of Patent: Mar. 19, 2013

(54) SEMICONDUCTOR DEVICE, METHOD OF MANUFACTURING THE SAME, AND METHOD OF FORMING MULTILAYER SEMICONDUCTOR THIN FILM

(75) Inventors: Norihito Kobayashi, Kanagawa (JP); Mari Sasaki, Kanagawa (JP); Takahiro Ohe, Tokyo (JP)

(73) Assignee: Sony Corporation, Tokyo (JP)

( * ) Notice: Subject to any disclaimer, the term of this patent is extended or adjusted under 35 U.S.C. 154(b) by 289 days.

(21) Appl. No.: 12/848,732

(22) Filed: Aug. 2, 2010

(65) Prior Publication Data
US 2012/0025173 A1 Feb. 2, 2012

(51) Int. Cl.
*H01L 51/40* (2006.01)
(52) U.S. Cl. ........ 438/99; 438/82; 257/40; 257/E51.001; 257/E51.005; 257/E51.006; 257/E51.007
(58) Field of Classification Search .......... 257/40, 257/E51.001, E51.005, E51.006, E51.007; 438/82, 99
See application file for complete search history.

(56) References Cited

U.S. PATENT DOCUMENTS
6,690,029 B1  2/2004  Anthony et al.

OTHER PUBLICATIONS

Norihito Kobayashi, Stable peri-Xanthenoxanthene Thin Film Transistors with Efficient Carrier Injection, Jan. 12, 2009, Chem. Matr., 21, 552-556.*

* cited by examiner

*Primary Examiner* — Eduardo A Rodela
(74) *Attorney, Agent, or Firm* — SNR Denton US LLP

(57) ABSTRACT

A method of manufacturing a semiconductor device including a gate electrode, a gate insulating layer, source/drain electrodes, and a channel-forming region that are disposed on a base is provided. The method includes the steps of forming a thin film by application of a mixed solution including a polymeric insulating material and a dioxaanthanthrene compound represented by structural formula (1) below; and subsequently drying the thin film to induce phase separation of the polymeric insulating material and the dioxaanthanthrene compound, thereby forming the gate insulating layer from the polymeric insulating material and the channel-forming region from the dioxaanthanthrene compound:

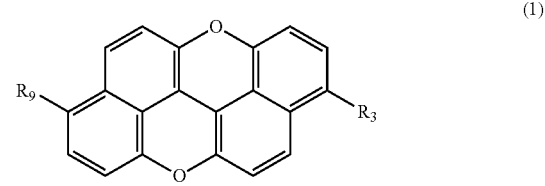

(1)

wherein at least one of $R_3$ and $R_9$ represents a substituent other than hydrogen.

15 Claims, 9 Drawing Sheets

SEMICONDUCTOR DEVICE, METHOD OF MANUFACTURING THE SAME, AND METHOD OF FORMING MULTILAYER SEMICONDUCTOR THIN FILM

BACKGROUND OF THE INVENTION

1. Field of the Invention

The present invention relates to a semiconductor device including a channel-forming region composed of a dioxaanthanthrene compound, a method of manufacturing the same, and a method of forming a multilayer semiconductor thin film including a semiconductor layer composed of a dioxaanthanthrene compound.

2. Description of the Related Art

In recent years, semiconductor devices including semiconductor layers composed of organic semiconductor materials have been receiving considerable attention. In such semiconductor devices, semiconductor layers can be formed by low-temperature coating in contrast to structures including semiconductor layers composed of inorganic materials. Therefore, such semiconductor devices are advantageous in that device area can be increased, and can be disposed on a flexible substrate that has low heat resistance, such as a plastic substrate. An increase in the range of functions and a reduction in cost are also expected.

As organic semiconductor materials constituting semiconductor layers, for example, polyacenes, such as anthracene, naphthacene, and pentacene, the structural formulae of which are shown below, have been widely researched to date.

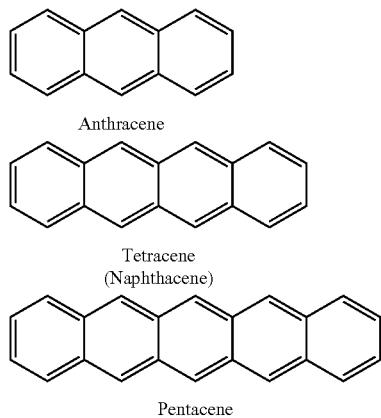

Anthracene

Tetracene
(Naphthacene)

Pentacene

These acene compounds have high crystallinity because of strong cohesion resulting from the intermolecular interactions utilizing the "C—H . . . pi" interactions between adjacent molecules. Here, the "C—H . . . pi" interaction is one of the interactions acting between two adjacent molecules and refers to the state in which the C—H groups (edges) in the periphery of a molecule are weakly attracted toward the pi orbital (faces) above and below the molecular plane, generally resulting in an edge-to-face arrangement. In the solid state, the molecules pack in a herringbone arrangement in which the molecules are in contact with each other at planes and sides. It has been reported that such an arrangement provides high carrier mobility and exhibits excellent semiconductor device properties (refer to Wei-Qiao Deng and William A. Goddard III, J. Phys. Chem. B, 2004 American Chemical Society, Vol. 108, No. 25, 2004, p. 8614-8621).

However, in general, it is considered that the herringbone packing arrangement is disadvantageous to carrier conduction in view of overlapping of molecular orbitals when compared to packing in the pi-stacking arrangement in which molecules are stacked such that the molecular planes are arranged in parallel. Accordingly, a method has been proposed in which the herringbone packing arrangement is prevented by introducing bulky substituents into the pentacene skeleton, and the pentacene backbones responsible for carrier conduction are allowed to pack in a pi-stacking arrangement as shown in FIG. 9 (refer to U.S. Pat. No. 6,690,029 B1).

SUMMARY OF THE INVENTION

However, in order to achieve packing of pentacene backbones in the pi-stacking arrangement, it is necessary to introduce bulky substituents as described above, which results in low freedom of molecular design. Therefore, it is difficult, for example, to precisely adjust the physical properties according to processes.

Furthermore, with respect to peri-xanthenoxanthenes, a method of producing the peri-xanthenoxanthene molecules themselves has been reported by Pummerer et al. (refer to Ber. Dtsch. Chem. Ges., 59, 2159, 1926). Furthermore, it has been known that the molecules pack in the pi-stacking arrangement in the neutral state in the absence of an applied voltage and in the ionic state in the presence of an applied voltage (refer to Asari, et al., Bull. Chem. Soc. Jpn., 74, 53, 2001). Furthermore, peri-xanthenoxanthene derivatives have been reported by A. E. Wetherby Jr., et al. (refer to Inorg. Chim. Acta., 360, 1977, 2007). Such peri-xanthenoxanthene derivatives have bulky substituents, and are completely different from dioxaanthanthrene compounds according to the embodiments of the present invention which will be described later.

It is desirable to provide a semiconductor device including a channel-forming region composed of a dioxaanthanthrene compound which provides high carrier mobility and high freedom of molecular design and which has excellent adaptability to processes, and a method of manufacturing the semiconductor device, and to provide a method of forming a multilayer semiconductor thin film including a semiconductor layer composed of a dioxaanthanthrene compound.

A method of manufacturing a semiconductor device including a gate electrode, a gate insulating layer, source/drain electrodes, and a channel-forming region that are disposed on a base according to a first embodiment of the present invention includes the steps of forming a thin film by application of a mixed solution including a polymeric insulating material and a dioxaanthanthrene compound represented by structural formula (1) below, and subsequently drying the thin film to induce phase separation of the polymeric insulating material and the dioxaanthanthrene compound represented by structural formula (1) below, thereby forming the gate insulating layer from the polymeric insulating material and the channel-forming region from the dioxaanthanthrene compound represented by structural formula (1) below:

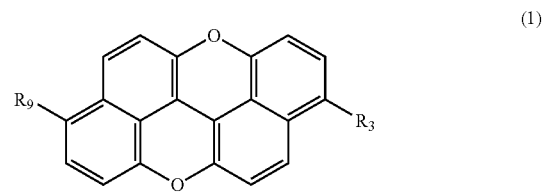

(1)

wherein at least one of $R_3$ and $R_9$ represents a substituent other than hydrogen. In addition, the dioxaanthanthrene compound represented by structural formula (1) is referred to as the "dioxaanthanthrene compound according to the first embodiment" for the sake of convenience. In other words, the dioxaanthanthrene compound according to the first embodiment is an organic semiconductor material which is obtained by replacement with a substituent other than hydrogen at least one of positions 3 and 9 of 6,12-dioxaanthanthrene (perixanthenoxanthene, which may be abbreviated as "PXX").

A method of manufacturing a semiconductor device including a gate electrode, a gate insulating layer, source/drain electrodes, and a channel-forming region that are disposed on a base according to a second embodiment of the present invention includes the steps of forming a thin film by application of a mixed solution including a polymeric insulating material and a dioxaanthanthrene compound represented by structural formula (2) below; and subsequently drying the thin film to induce phase separation of the polymeric insulating material and the dioxaanthanthrene compound represented by structural formula (2) below, thereby forming the gate insulating layer from the polymeric insulating material and the channel-forming region from the dioxaanthanthrene compound represented by structural formula (2) below:

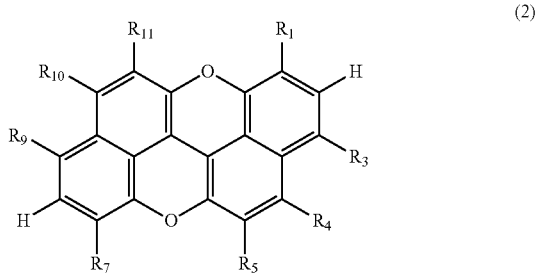

(2)

wherein at least one of $R_1$, $R_3$, $R_4$, $R_5$, $R_7$, $R_9$, $R_{10}$, and $R_{11}$ represents a substituent other than hydrogen. In addition, the dioxaanthanthrene compound represented by structural formula (2) is referred to as the "dioxaanthanthrene compound according to the second embodiment" for the sake of convenience. In other words, the dioxaanthanthrene compound according to the second embodiment an organic semiconductor material which is obtained by replacement with a substituent other than hydrogen at least one of positions 1, 3, 4, 5, 7, 9, 10, and 11 of 6,12-dioxaanthanthrene.

There may be cases where some amount of the dioxaanthanthrene compound represented by structural formula (1) or structural formula (2) is mixed in the gate insulating layer composed of the polymeric insulating material, while some amount of the polymeric insulating material is mixed in the channel-forming region composed of the dioxaanthanthrene compound represented by structural formula (1) or structural formula (2).

A method of forming a multilayer semiconductor thin film according to a first embodiment of the present invention includes the steps of forming a thin film by applying a mixed solution including (a) a first material composed of a polymeric insulating material and (b) a second material composed of a dioxaanthanthrene compound represented by structural formula (1) described above onto a substrate, and subsequently drying the thin film to induce phase separation of the first material and the second material, thereby producing a stacked structure including a first layer composed of the first material and a second layer composed of the second material.

A method of forming a multilayer semiconductor thin film according to a second embodiment of the present invention includes the steps of forming a thin film by applying a mixed solution including (a) a first material composed of a polymeric insulating material and (b) a second material composed of a dioxaanthanthrene compound represented by structural formula (2) described above onto a substrate, and subsequently drying the thin film to induce phase separation of the first material and the second material, thereby producing a stacked structure including a first layer composed of the first material and a second layer composed of the second material.

There may be cases where some amount of the dioxaanthanthrene compound represented by structural formula (1) or structural formula (2) is mixed in the first layer, while some amount of the polymeric insulating material is mixed in the second layer composed of the dioxaanthanthrene compound represented by structural formula (1) or structural formula (2).

A semiconductor device according to a first embodiment of the present invention includes a gate electrode, a gate insulating layer, source/drain electrodes, and a channel-forming region that are disposed on a base, in which the channel-forming region is composed of a dioxaanthanthrene compound represented by structural formula (1) described above, and the gate insulating layer is composed of PaMS.

A semiconductor device according to a second embodiment of the present invention includes a gate electrode, a gate insulating layer, source/drain electrodes, and a channel-forming region that are disposed on a base, in which the channel-forming region is composed of a dioxaanthanthrene compound represented by structural formula (2) described above, and the gate insulating layer is composed of PaMS.

In semiconductor devices, the interface between the channel-forming region and the gate insulating layer has been considered as a region in which electric charges move, and is one of the most important parts that influence characteristics of semiconductor devices. Research has been conducted to improve characteristics of semiconductor devices by treating the surface of gate insulating layers using a surface-treating agent. For example, it has been reported that treatment of the surface of thermal oxide formed on the surface of a silicon substrate using an interface-treating agent, such as octadecyltrichlorosilane (OTS) or hexamethylenedisilazane (HMDS), improves characteristics of semiconductor devices. However, in such surface treatment, not only an additional treatment step is necessary, but also nano-scale irregularities may occur on the surface of gate insulating layers depending on treatment conditions, thus adversely affecting characteristics of semiconductor devices.

According to some embodiments of the present invention, a thin film is formed by application of a mixed solution including a polymeric insulating material and a dioxaanthanthrene compound having a specific structure, and subsequently the thin film is dried to induce phase separation of the polymeric insulating material and the dioxaanthanthrene compound having the specific structure, thereby forming a gate insulating layer from the polymeric insulating material and a channel-forming region from the dioxaanthanthrene compound having the specific structure. Alternatively, a thin film is formed by applying a mixed solution including a first material and a second material, and subsequently the thin film is dried to induce phase separation of the first material and the second material, thereby producing a stacked structure including a first layer composed of the first material and a second layer composed of the second material. Consequently, it is not necessary to perform surface treatment on the gate insulating layer or the first layer.

Moreover, in the dioxaanthanthrene compound according to any of the embodiments of the present invention suitable for forming semiconductor layers, the molecules pack in the pi-stacking arrangement in the neutral state in the absence of an applied voltage and in the ionic state in the presence of an applied voltage. Therefore, without introducing bulky substituents, the backbones of the dioxaanthanthrene compound according to any of the embodiments of the present invention can easily pack in the pi-stacking arrangement. Consequently, it is possible to increase the freedom of molecular design of an organic semiconductor material constituting semiconductor layers that exhibit high carrier mobility, and to facilitate molecular design. Moreover, adaptability to processes can be improved. That is, channel-forming regions can be formed by a wet process, such as coating or printing. Thereby, it is possible to easily produce organic semiconductor thin films having high carrier mobility as well as high stability, durability, and heat resistance, and high-performance semiconductor devices.

DESCRIPTION OF THE PREFERRED EMBODIMENTS

Figure 1:
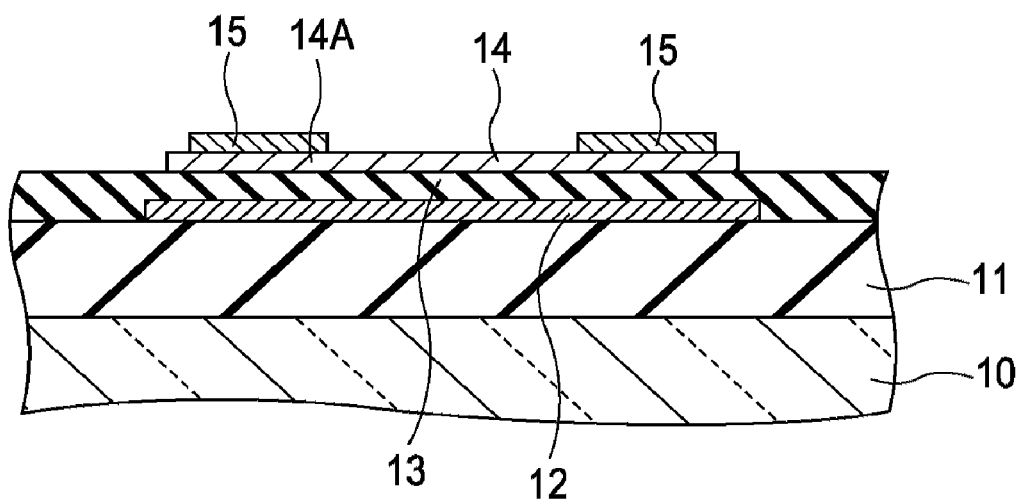
FIG. 1 is a schematic partial sectional view of a bottom gate/top contact type field-effect transistor.

The embodiments of the present invention will be described on the basis of examples with reference to the drawings. However, it is to be understood that the present invention is not limited to the examples, and various numerical values and materials in the examples are merely for illustrative purposes. The description will be made in the following order:
1. Overall description on semiconductor devices according to first and second embodiments of the present invention, methods of manufacturing the same, and methods of forming multilayer semiconductor thin films according to first and second embodiments of the present invention
2. Example 1 (Semiconductor devices according to first and second embodiments of the present invention, methods of manufacturing the same, and methods of forming multilayer semiconductor thin films according to first and second embodiments of the present invention)
3. Example 2 (Modification of Example 1)
4. Example 3 (Another modification of Example 1)
5. Example 4 (Dioxaanthanthrene compounds according to first to fourth embodiments of the present invention)
6. Example 5 (Dioxaanthanthrene compounds according to first to third and fifth embodiments of the present invention)
7. Example 6 (Dioxaanthanthrene compounds according to first to third and sixth embodiments of the present invention)
8. Example 7 (Dioxaanthanthrene compounds according to first to third and seventh embodiments of the present invention)
9. Example 8 (Dioxaanthanthrene compounds according to first to third and eighth embodiments of the present invention)
10. Example 9 (Dioxaanthanthrene compounds according to first to third and ninth embodiments of the present invention)
11. Example 10 (Dioxaanthanthrene compounds according to first to third and tenth embodiments of the present invention)
12. Example 11 (Dioxaanthanthrene compounds according to first to third and eleventh embodiments of the present invention)
13. Example 12 (Dioxaanthanthrene compounds according to first to third and twelfth embodiments of the present invention)
14. Example 13 (Dioxaanthanthrene compounds according to first to third and thirteenth embodiments of the present invention)
15. Example 14 (Dioxaanthanthrene compounds according to first to third and fourteenth embodiments of the present invention)
16. Example 15 (Dioxaanthanthrene compounds according to first to third and fifteenth embodiments of the present invention), and others

[Overall Description on Semiconductor Devices According to First and Second Embodiments of the Present Invention, Methods of Manufacturing the Same, and Methods of Forming Multilayer Semiconductor Thin Films According to First and Second Embodiments of the Present Invention]

In the method of manufacturing a semiconductor device according to the first or second embodiment of the present invention (hereinafter, may be collectively simply referred to as the "method of manufacturing a semiconductor device according to the embodiment of the present invention"), or in the method of forming a multilayer semiconductor thin film according to the first or second embodiment of the present invention (hereinafter, may be collectively simply referred to as the "method of forming a multilayer semiconductor thin film according to the embodiment of the present invention"), preferably, by adjusting the molecular weight of the polymeric insulating material, phase separation of the polymeric insulating material and the dioxaanthanthrene compound represented by structural formula (1) or (2) is induced.

In the method of manufacturing a semiconductor device or the method of forming a multilayer semiconductor thin film according to the embodiment of the present invention including any of the preferred embodiments described above, preferably, the Gibbs energy of mixing of a mixing system of the polymeric insulating material and the dioxaanthanthrene compound represented by structural formula (1) or structural formula (2) constituting the mixed solution has a positive value.

Furthermore, in the method of manufacturing a semiconductor device or the method of forming a multilayer semiconductor thin film according to the embodiment of the present invention including any of the preferred embodiments described above, preferably, the polymeric insulating material is composed of poly(alpha-methyl styrene) (PaMS). However, the polymeric insulating material is not limited to this, and the polymeric insulating material may be composed of at least one selected from the group consisting of polystyrene (PS), Topas, Marproof, DAP, and poly(halogenated styrene).

In the method of forming a multilayer semiconductor thin film according to the first or second embodiment of the present invention, it is possible to configure a stacked structure including a first layer composed of the first material and a second layer composed of the second material disposed in that order from the substrate side.

In the description below, the semiconductor devices according to the first embodiment of the present invention including the preferred configurations and embodiments described above, the method of manufacturing a semiconductor device according to the first embodiment of the present invention, or the method of forming a multilayer semiconductor thin film according to the first embodiment of the present invention may be collectively simply referred to as the "first embodiment of the present invention". Furthermore, the semiconductor devices according to the second embodiment of the present invention including the preferred configurations and embodiments described above, the method of manufacturing a semiconductor device according to the second embodiment of the present invention, or the method of forming a multilayer semiconductor thin film according to the second embodiment of the present invention may be collectively simply referred to as the "second embodiment of the present invention".

The first embodiment of the present invention may include the following cases:

(1-1) Case where $R_3$ is a substituent other than hydrogen, and $R_9$ is a hydrogen atom.

(1-2) Case where $R_9$ is a substituent other than hydrogen, and $R_3$ is a hydrogen atom.

(1-3) Case where $R_3$ and $R_9$ are each a substituent other than hydrogen. In case (1-3), $R_3$ and $R_9$ may be the same substituent or different substituents.

The second embodiment of the present invention may include the following cases:

(2-1) Case where $R_1$ is a substituent other than hydrogen, and $R_3$ to $R_{11}$ are each a substituent other than hydrogen or a hydrogen atom ($2^7$ cases in total).

(2-2) Case where $R_3$ is a substituent other than hydrogen, and $R_1$ and $R_4$ to $R_{11}$ are each a substituent other than hydrogen or a hydrogen atom ($2^7$ cases in total).

(2-3) Case where $R_4$ is a substituent other than hydrogen, and $R_1$, $R_3$, and $R_5$ to $R_{11}$ are each a substituent other than hydrogen or a hydrogen atom ($2^7$ cases in total).

(2-4) Case where $R_5$ is a substituent other than hydrogen, and $R_1$ to $R_4$ and $R_7$ to $R_{11}$ are each a substituent other than hydrogen or a hydrogen atom ($2^7$ cases in total).

(2-5) Case where $R_7$ is a substituent other than hydrogen, and $R_1$ to $R_5$ and $R_9$ to $R_{11}$ are each a substituent other than hydrogen or a hydrogen atom ($2^7$ cases in total).

(2-6) Case where $R_9$ is a substituent other than hydrogen, and $R_1$ to $R_7$, $R_{10}$, and $R_{11}$ are each a substituent other than hydrogen or a hydrogen atom ($2^7$ cases in total).

(2-7) Case where $R_{10}$ is a substituent other than hydrogen, and $R_1$ to $R_9$ and $R_{11}$ are each a substituent other than hydrogen or a hydrogen atom ($2^7$ cases in total).

(2-8) Case where $R_{11}$ is a substituent other than hydrogen, and $R_1$ to $R_{10}$ are each a substituent other than hydrogen or a hydrogen atom ($2^7$ cases in total).

The cases described above include duplicate cases. $R_1$, $R_3$, $R_4$, $R_5$, $R_7$, $R_9$, $R_{10}$, and $R_{11}$ may be the same substituent or different substituents.

In the second embodiment of the present invention, at least one of $R_3$ and $R_9$ may be a substituent other than hydrogen, and at least one of $R_1$, $R_4$, $R_5$, $R_7$, $R_{10}$, and $R_{11}$ may be a substituent other than hydrogen. Furthermore, in the second embodiment of the present invention, at least one of $R_3$ and $R_9$ may be a substituent other than hydrogen, and at least one of $R_4$, $R_5$, $R_{10}$, and $R_{11}$ may be a substituent other than hydrogen.

Specifically, for example, such preferred embodiments may include the following cases:

(3-1) Case where $R_3$ is a substituent other than hydrogen, and $R_1$ and $R_4$ to $R_{11}$ are each a substituent other than hydrogen or a hydrogen atom ($2^7$ cases in total).

(3-2) Case where $R_9$ is a substituent other than hydrogen, and $R_1$ to $R_7$, $R_{10}$, and $R_{11}$ are each a substituent other than hydrogen or a hydrogen atom ($2^7$ cases in total).

(3-3) Case where $R_3$ and $R_9$ are each a substituent other than hydrogen, and $R_1$, $R_4$, $R_5$, $R_7$, $R_{10}$, and $R_{11}$ are each a substituent other than hydrogen or a hydrogen atom ($2^6$ cases in total).

(3-4) Case where $R_3$ is a substituent other than hydrogen, $R_1$ is a hydrogen atom, and $R_4$ to $R_{11}$ are each a substituent other than hydrogen or a hydrogen atom ($2^6$ cases in total).

(3-5) Case where $R_3$ is a substituent other than hydrogen, $R_7$ is a hydrogen atom, and $R_1$, $R_4$, $R_5$, and $R_9$ to $R_{11}$ are each a substituent other than hydrogen or a hydrogen atom ($2^6$ cases in total).

(3-6) Case where $R_9$ is a substituent other than hydrogen, $R_1$ is a hydrogen atom, and $R_3$ to $R_7$, $R_{10}$, and $R_{11}$ are each a substituent other than hydrogen or a hydrogen atom ($2^6$ cases in total).

(3-7) Case where $R_9$ is a substituent other than hydrogen, $R_7$ is a hydrogen atom, and $R_1$, $R_3$ to $R_5$, $R_{10}$, and $R_{11}$ are each a substituent other than hydrogen or a hydrogen atom ($2^6$ cases in total).

(3-8) Case where $R_3$ and $R_9$ are each a substituent other than hydrogen, $R_1$ is a hydrogen atom, and $R_4$ to $R_7$, $R_{10}$, and $R_{11}$ are each a substituent other than hydrogen or a hydrogen atom ($2^5$ cases in total).

(3-9) Case where $R_3$ and $R_9$ are each a substituent other than hydrogen, $R_7$ is a hydrogen atom, and $R_1$, $R_4$, $R_5$, $R_{10}$, and $R_{11}$ are each a substituent other than hydrogen or a hydrogen atom ($2^5$ cases in total).

(3-10) Case where $R_3$ and $R_9$ are each a substituent other than hydrogen, $R_1$ and $R_7$ are each a hydrogen atom, and $R_4$, $R_5$, $R_{10}$, and $R_{11}$ are each a substituent other than hydrogen or a hydrogen atom ($2^4$ cases in total).

The cases described above include duplicate cases. $R_1$, $R_3$, $R_4$, $R_5$, $R_7$, $R_9$, $R_{10}$, and $R_{11}$ may be the same substituent or different substituents.

In the embodiments including the preferred embodiments of the present invention, the substituent other than hydrogen may be a substituent selected from the group consisting of an alkyl group, a cycloalkyl group, an alkenyl group, an alkynyl group, an aryl group, an aryl-alkyl group, an aromatic heterocycle, a heterocyclic group, an alkoxy group, a cycloalkoxy group, an aryloxy group, an alkylthio group, a cycloalkylthio group, an arylthio group, an alkoxycarbonyl group, an aryloxycarbonyl group, a sulfamoyl group, an acyl group, an acyloxy group, an amide group, a carbamoyl group, a ureido group, a sulfinyl group, an alkylsulfonyl group, an arylsulfonyl group, an amino group, a halogen atom, a fluorohydrocarbon group, a cyano group, a nitro group, a hydroxy group, a mercapto group, and a silyl group.

Furthermore, in the embodiments including the preferred embodiments of the present invention, the substituent other than hydrogen may be a substituent selected from the group consisting of an alkyl group, an alkenyl group, an aryl group, an aryl-alkyl group, an aromatic heterocycle, and a halogen atom.

Examples of the alkyl group include methyl, ethyl, propyl, isopropyl, tertiary butyl, pentyl, hexyl, octyl, and dodecyl groups, which may be straight-chain or branched. Examples of the cycloalkyl group include cyclopentyl and cyclohexyl groups; examples of the alkenyl group include a vinyl group; examples of the alkynyl group include an ethynyl group; examples of the aryl group include phenyl, naphthyl, and biphenyl groups; examples of the aryl-alkyl group include methylaryl, ethylaryl, isopropylaryl, normal butylaryl, p-tolyl, p-ethylphenyl, p-isopropylphenyl, 4-propylphenyl, 4-butylphenyl, and 4-nonylphenyl groups; examples of the aromatic heterocycle include pyridyl, thienyl, furyl, pyridazinyl, pyrimidinyl, pyrazinyl, triazinyl, imidazolyl, pyrazolyl, thiazolyl, quinazolinyl, and phthalazinyl groups; examples of the heterocyclic group include pyrrolidyl, imidazolidyl, morpholinyl, and oxazolidyl groups; examples of the alkoxy group include methoxy, ethoxy, propyloxy, pentyloxy, and hexyloxy groups; examples of the cycloalkoxy group include cyclopentyloxy and cyclohexyloxy groups; examples of the aryloxy group include phenoxy and naphthyloxy groups; examples of the alkylthio group include methylthio, ethylthio, propylthio, pentylthio, and hexylthio groups; examples of the cycloalkylthio group include cyclopentylthio and cyclohexylthio groups; examples of the arylthio group include phenylthio and naphthylthio groups; examples of the alkoxycarbonyl group include methyloxycarbonyl, ethyloxycarbonyl, butyloxycarbonyl, and octyloxycarbonyl groups; examples of the aryloxycarbonyl group include phenyloxycarbonyl and naphthyloxycarbonyl groups; examples of the sulfamoyl group include aminosulfonyl, methylaminosulfonyl, dimethylaminosulfonyl, cyclohexylaminosulfonyl, phenylaminosulfonyl, naphthylaminosulfonyl, and 2-pyridylaminosulfonyl groups; examples of the acyl group include acetyl, ethylcarbonyl, propylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups; examples of the acyloxy group include acetyloxy, ethylcarbonyloxy, octylcarbonyloxy, and phenylcarbonyloxy groups; examples of the amide group include methylcarbonylamino, ethylcarbonylamino, dimethylcarbonylamino, pentylcarbonylamino, cyclohexylcarbonylamino, 2-ethylhexylcarbonylamino, phenylcarbonylamino, and naphthylcarbonylamino groups; examples of the carbamoyl group include aminocarbonyl, methylaminocarbonyl, dimethylaminocarbonyl, cyclohexylaminocarbonyl, 2-ethylhexylaminocarbonyl, phenylaminocarbonyl, naphthylaminocarbonyl, and 2-pyridylaminocarbonyl groups; examples of the ureido group include methylureido, ethylureido, cyclohexylureido, dodecylureido, phenylureido, naphthylureido, and 2-pyridylaminoureido groups; examples of the sulfinyl group include methylsulfinyl, ethylsulfinyl, butylsulfinyl, cyclohexylsulfinyl, 2-ethylhexylsulfinyl, phenylsulfinyl, naphthylsulfinyl, and 2-pyridylsulfinyl groups; examples of the alkylsulfonyl group include methylsulfonyl, ethylsulfonyl, butylsulfonyl, cyclohexylsulfonyl, 2-ethylhexylsulfonyl, and dodecylsulfonyl groups; examples of the arylsulfonyl group include phenylsulfonyl, naphthylsulfonyl, and 2-pyridylsulfonyl groups; examples of the amino group include amino, ethylamino, dimethylamino, butylamino, 2-ethylhexylamino, anilino, naphthylamino, and 2-pyridylamino groups; examples of the halogen atom include fluorine, chlorine, bromine, and iodine atoms; and examples of the fluorohydrocarbon group include fluoromethyl, trifluoromethyl, pentafluoroethyl, and pentafluorophenyl groups. Other examples of the substituent include cyano, nitro, hydroxy, and mercapto groups. Examples of the silyl group include trimethylsilyl, triisopropylsilyl, triphenylsilyl, and phenyldiethylsilyl groups. These substituents may be further replaced with another substituent described above. Moreover, a plurality of substituents may be combined together to form a ring.

Furthermore, instead of the dioxaanthanthrene compounds according to the first or second embodiment of the present invention, dioxaanthanthrene compounds described below may be used.

A dioxaanthanthrene compound according to a third embodiment of the present invention includes 6,12-dioxaanthanthrene which is replaced at least one of positions 3 and 9 with a substituent other than hydrogen, the dioxaanthanthrene compound being obtained by halogenating peri-xanthenoxanthene into 3,9-dihalo-peri-xanthenoxanthene and then replacing the halogen atom with the substituent. In this case, the halogen atom may be bromine (Br). In the dioxaanthanthrene compound according to the third embodiment of the present invention including such a case, the substituent may be an aryl group or aryl-alkyl group, may be an aryl group which is replaced at least one of positions 2 to 6 with an alkyl group, or may be an aryl group which is replaced at least one of positions 2 to 6 with an aryl group. Furthermore, the substituent may be a p-tolyl group, p-ethylphenyl group, p-isopropylphenyl group, 4-propylphenyl group, 4-butylphenyl group, 4-nonylphenyl group, or p-biphenyl.

A dioxaanthanthrene compound according to a fourth embodiment of the present invention includes 3,9-diphenyl-peri-xanthenoxanthene obtained by reacting peri-xanthenoxanthene with bromine to produce 3,9-dibromo-peri-xanthenoxanthene, and then by replacing bromine atoms with phenyl groups.

A dioxaanthanthrene compound according to a fifth embodiment of the present invention includes 3,9-di(trans-1-octen-1-yl)-peri-xanthenoxanthene obtained by reacting peri-xanthenoxanthene with bromine to produce 3,9-dibromo-peri-xanthenoxanthene, and then by replacing bromine atoms with trans-1-octen-1-yl groups.

A dioxaanthanthrene compound according to a sixth embodiment of the present invention includes 3,9-di(2-naphthyl)-peri-xanthenoxanthene obtained by reacting peri-xanthenoxanthene with bromine to produce 3,9-dibromo-peri-xanthenoxanthene, and then by replacing bromine atoms with β-naphthyl groups.

A dioxaanthanthrene compound according to a seventh embodiment of the present invention includes 3,9-bis(2,2'-bithiophen-5-yl)-peri-xanthenoxanthene obtained by reacting peri-xanthenoxanthene with bromine to produce 3,9-dibromo-peri-xanthenoxanthene, and then by replacing bromine atoms with 2,2'-bithiophen-5-yl groups.

A dioxaanthanthrene compound according to an eighth embodiment of the present invention includes 3,9-bis(trans-2-(4-pentylphenyl)vinyl)-peri-xanthenoxanthene obtained by reacting peri-xanthenoxanthene with bromine to produce 3,9-dibromo-peri-xanthenoxanthene, and then by replacing bromine atoms with trans-2-(4-pentylphenyl)vinyl groups.

A dioxaanthanthrene compound according to a ninth embodiment of the present invention includes 3,9-di(p-tolyl)-peri-xanthenoxanthene obtained by reacting peri-xanthenoxanthene with bromine to produce 3,9-dibromo-peri-xanthenoxanthene, and then by replacing bromine atoms with p-tolyl groups.

A dioxaanthanthrene compound according to a tenth embodiment of the present invention includes 3,9-bis(p-ethylphenyl)-peri-xanthenoxanthene obtained by reacting peri-xanthenoxanthene with bromine to produce 3,9-dibromo-peri-xanthenoxanthene, and then by replacing bromine atoms with p-ethylphenyl groups.

A dioxaanthanthrene compound according to an eleventh embodiment of the present invention includes 3,9-bis(p-isopropylphenyl)-peri-xanthenoxanthene obtained by reacting peri-xanthenoxanthene with bromine to produce 3,9-dibromo-peri-xanthenoxanthene, and then by replacing bromine atoms with p-isopropylphenyl groups.

A dioxaanthanthrene compound according to a twelfth embodiment of the present invention includes 3,9-bis(4-propylphenyl)-peri-xanthenoxanthene obtained by reacting peri-xanthenoxanthene with bromine to produce 3,9-dibromo-peri-xanthenoxanthene, and then by replacing bromine atoms with 4-propylphenyl groups.

A dioxaanthanthrene compound according to a thirteenth embodiment of the present invention includes 3,9-bis(4-butylphenyl)-peri-xanthenoxanthene obtained by reacting perixanthenoxanthene with bromine to produce 3,9-dibromo-peri-xanthenoxanthene, and then by replacing bromine atoms with 4-butylphenyl groups.

A dioxaanthanthrene compound according to a fourteenth embodiment of the present invention includes 3,9-bis(4-nonylphenyl)-peri-xanthenoxanthene obtained by reacting peri-xanthenoxanthene with bromine to produce 3,9-dibromo-peri-xanthenoxanthene, and then by replacing bromine atoms with 4-nonylphenyl groups.

A dioxaanthanthrene compound according to a fifteenth embodiment of the present invention includes 3,9-bis(p-biphenyl)-peri-xanthenoxanthene obtained by reacting peri-xanthenoxanthene with bromine to produce 3,9-dibromo-peri-xanthenoxanthene, and then by replacing bromine atoms with p-biphenyl groups.

In a semiconductor device including a gate electrode, a gate insulating layer, source/drain electrodes, and a channel-forming region that are disposed on a base, the channel-forming region may be composed of any of the dioxaanthanthrene compounds according to the third to fifteenth embodiments of the present invention described above. Furthermore, such a semiconductor device can also be configured as a bottom gate/top contact type field-effect transistor (FET) which will be described below.

In the case where the semiconductor device according to the first or second embodiment of the present invention is configured as a bottom gate/top contact type FET, the bottom gate/top contact type FET includes (A) a gate electrode disposed on a base, (B) a gate insulating layer disposed on the gate electrode, (C) a channel-forming region and a channel-forming region extension disposed on the gate insulating layer, and (D) source/drain electrodes disposed on the channel-forming region extension.

The base can be composed of a silicon oxide-based material, such as $SiO_X$ or spin-on glass (SOG); silicon nitride ($SiN_Y$); aluminum oxide ($Al_2O_3$); or a metal oxide high-dielectric-constant insulating film. When the base is composed of such a material, the base may be formed on (or above) a support composed of any of the materials described below. That is, examples of the material for the support and/or a base other than the base described above include organic polymers, such as polymethyl methacrylate (PMMA), polyvinyl alcohol (PVA), polyvinyl phenol (PVP), polyethersulfone (PES), polyimide, polycarbonate, polyethylene terephthalate (PET), and polyethylene naphthalate (PEN); and mica. When organic polymers are used, the polymeric materials are formed into plastic films, plastic sheets, and plastic substrates having flexibility. By using a base composed of any of such flexible polymeric materials, for example, the resulting field-effect transistor can be built in or integrated into a display device or electronic apparatus having curved surfaces. Other examples of the base include various glass substrates, various glass substrates provided with insulating films on the surfaces thereof, quartz substrates, quartz substrates provided with insulating films on the surfaces thereof, silicon substrates provided with insulating films on the surfaces thereof, and metal substrates composed of various alloys or various metals, such as stainless steel. As a support having electrical insulating properties, an appropriate material may be selected from the materials described above. Other examples of the support include conductive substrates, such as a substrate composed of a metal (e.g., gold), a substrate composed of highly oriented graphite, and a stainless steel substrate. Furthermore, depending on the configuration and structure of the semiconductor device, the semiconductor device may be provided on a support. Such a support can be composed of any of the materials described above.

Examples of the material constituting the gate electrode, source/drain electrodes, and interconnect lines include metals, such as platinum (Pt), gold (Au), palladium (Pd), chromium (Cr), molybdenum (Mo), nickel (Ni), aluminum (Al), silver (Ag), tantalum (Ta), tungsten (W), copper (Cu), titanium (Ti), indium (In), and tin (Sn), alloys containing these metal elements, conductive particles composed of these metals, conductive particles composed of alloys containing these metals, and conductive materials, such as impurity-containing polysilicon. A stacked structure including layers containing these elements may be employed. Furthermore, as the material constituting the gate electrode, source/drain electrodes, and interconnect lines, an organic material (conductive polymer), such as poly(3,4-ethylenedioxythiophene)/polystyrene sulfonic acid [PEDOT/PSS], may be mentioned. The materials constituting the gate electrode, source/drain electrodes, and interconnect lines may be the same or different.

Examples of the method for forming the gate electrode, source/drain electrodes, and interconnect lines include, although depending on the materials constituting them, physical vapor deposition (PVD) methods; various chemical vapor deposition (CVD) methods, such as MOCVD; spin coating methods; various printing methods, such as screen printing, ink-jet printing, offset printing, reverse offset printing, gravure printing, and microcontact printing; various coating methods, such as air-doctor coating, blade coating, rod coating, knife coating, squeeze coating, reverse roll coating, transfer roll coating, gravure coating, kiss coating, cast coating, spray coating, slit orifice coating, calender coating, and dipping; stamping methods; lift-off methods; shadow-mask methods; plating methods, such as electrolytic plating, electroless plating, or a combination of both; and spraying methods. As necessary, these methods may be combined with patterning techniques. Furthermore, examples of PVD methods include (a) various vacuum deposition methods, such as electron beam heating, resistance heating, flash vapor deposition, and crucible heating; (b) plasma deposition methods; (c) various sputtering methods, such as diode sputtering, DC sputtering, DC magnetron sputtering, RF sputtering, magnetron sputtering, ion beam sputtering, and bias sputtering; and (d) various ion plating methods, such as a direct current (DC) method, an RF method, a multi-cathode method, an activation reaction method, an electric field deposition method, an RF ion plating method, and a reactive ion plating method.

Examples of the method for forming the thin film in which a mixed solution is applied and the method for forming the channel-forming region, or the channel-forming region and the channel-forming region extension include spin coating methods; various printing methods described above; various coating methods described above; dipping methods; casting methods; and spraying methods. As necessary, additives (e.g., doping materials, such as n-type impurities and p-type impurities) may be added to the dioxaanthanthrene compound according to the first or second embodiment of the present invention.

In the method of forming a multilayer semiconductor thin film according to the first or second embodiment of the present invention, and the method of manufacturing a semiconductor device according to the first or second embodiment of the present invention, in the process of applying and drying a mixed solution, a stacked structure is produced by phase separation. In this process, preferably, the second layer composed of the second material is (spontaneously) oriented with respect to the first layer.

As described above, preferably, the Gibbs energy of mixing of a mixing system of the first material and the second material constituting the mixed solution has a positive value. The reason for this will be described below. In statistical thermodynamics, given a mixing system, whether or not a plurality of types of material mix together depends on the Gibbs energy (G) of the entire mixing system, i.e., the Gibbs energy of mixing ($\Delta G_m$) expressed by formula (A) below. In the case where the Gibbs energy of mixing ($\Delta G_m$) is negative, a mixed state has low energy and is stable, and therefore, the system tends to proceed toward a state of being mixed. On the other hand, in the case where the Gibbs energy of mixing ($\Delta G_m$) is positive, the mixing system has high energy and is unstable, and therefore, the system does not undergo mixing and tends to proceed toward phase separation.

$$\Delta G_m = \Delta H_m - T \cdot \Delta S_m \quad (A)$$

where $\Delta H_m$ is the enthalpy variation of the system, $\Delta S_m$ is the entropy variation of the system, and T is the absolute temperature.

When a polymeric insulating material is used as the material constituting the gate insulating layer, the Gibbs energy of the mixing system ($\Delta G_m$) can be determined according to the Flory-Huggins theory. Regarding a mixing system including an organic solvent and a polymeric insulating material, which is a simple binary system, it is possible to apply the Gibbs energy of mixing ($\Delta G_m$) in the Flory-Huggins theory expressed by formula (B) below. When this value is positive, the system does not undergo mixing and tends to proceed toward phase separation.

$$\Delta G_m = k \cdot N_T \cdot T \cdot (\chi_{12} \cdot \phi_1 \cdot \phi_2) + k \cdot N_T \cdot T \cdot \{\phi_1 \cdot \ln(\phi_1) + (\phi_2/x) \cdot \ln(\phi_2)\} \quad (B)$$

where k is the Boltzmann constant, $N_T$ is the total number of lattice points [$N_T = N_1 + (x \cdot N_2)$, where $N_1$ is the number of molecules of the low-molecular weight substance, and $N_2$ is the number of molecules of the polymer], $\chi_{12}$ is the Flory $\chi$ parameter, $\phi_1 = N_1/N_T$, $\phi_2 = x \cdot N_2/N_T$, and x is the number of polymer units.

Formula (B) relates to the mixing system of the organic solvent and the polymeric insulating material. Therefore, in the calculation, a low-molecular weight organic semiconductor is introduced into the organic solvent term, and the number of units of the polymeric insulating material in formula (B) is adjusted in accordance with the molecular weight of the dioxaanthanthrene compound according to any of the first to fifteenth embodiments.

Thus, by appropriately selecting materials so that formula (C) below, which is constituted by four parameters extracted from formula (B), has a positive value, phase separation proceeds in the system. That is, desirably, the mixed solution is prepared by dissolving a mixture which makes formula (C) below to have a positive value in an appropriate solvent.

$$(\chi_{12} \cdot \phi_1 \cdot \phi_2) + \phi_1 \cdot \ln(\phi_1) + (\phi_2/x) \cdot \ln(\phi_2) > 0 \quad (C)$$

Note that, as the solvent, for example, tetralin, toluene, xylene, mesitylene, methylnaphthalene, hexane, heptane, or octane may be used.

When the semiconductor devices according to the embodiments of the present invention are applied to or used for display devices or various types of electronic apparatuses, monolithic integrated circuits in which many semiconductor devices are integrated on supports may be fabricated, or the individual semiconductor devices may be separated by cutting to produce discrete components. Furthermore, the semiconductor devices may be sealed with resins.

EXAMPLE 1

Example 1 relates to semiconductor devices according to the first and second embodiments of the present invention, methods of manufacturing the same, and methods of forming a multilayer semiconductor thin film according to the first and second embodiments of the present invention. A semiconductor device (specifically, field-effect transistor (FET), more specifically, thin-film transistor (TFT) of Example 1 includes a gate electrode, a gate insulating layer, source/drain electrodes, and a channel-forming region that are disposed on a base, in which the channel-forming region is composed of the dioxaanthanthrene compound represented by structural formula (1) described above, and the gate insulating layer is composed of PaMS, wherein at least one of $R_3$ and $R_9$ represents a substituent other than hydrogen. Furthermore, a semiconductor device of Example 1 includes a gate electrode, a gate insulating layer, source/drain electrodes, and a channel-forming region that are disposed on a base, in which the channel-forming region is composed of the dioxaanthanthrene compound represented by structural formula (2) described above, and the gate insulating layer is composed of PaMS, wherein at least one of $R_1$, $R_3$, $R_4$, $R_5$, $R_7$, $R_9$, $R_{10}$, and $R_{11}$ represents a substituent other than hydrogen.

More specifically, a semiconductor device of Example 1 is a bottom gate/top contact type FET (specifically, TFT), a schematic partial sectional view of which is shown in FIG. 1, and includes (A) a gate electrode 12 disposed on a base (10, 11), (B) a gate insulating layer 13 disposed on the gate electrode 12, (C) a channel-forming region 14 and a channel-forming region extension 14A disposed on the gate insulating layer 13, and (D) source/drain electrodes 15 disposed on the channel-forming region extension 14A.

The base (10, 11) includes a substrate 10 composed of a glass substrate and an insulating film 11 composed of $SiO_2$ disposed on the surface thereof. Each of the gate electrode 12 and the source/drain electrodes 15 is composed of a gold thin film. The gate insulating layer 13 is composed of PaMS as described above. Each of the channel-forming region 14 and the channel-forming region extension 14A is composed of any one of the dioxaanthanthrene compounds described in Examples 4 to 15. More specifically, in Example 1, each of the channel-forming region 14 and the channel-forming region extension 14A is composed of 3,9-bis(p-ethylphenyl)-peri-xanthenoxanthene [PXX—(C2Ph)$_2$] of Example 10 which will be described below, in which $R_3$ and $R_9$ are each an aryl-alkyl group. The gate electrode 12 and the gate insulating layer 13 are more specifically disposed on the insulating film 11.

An outline of a method for fabricating the bottom gate/top contact type FET (specifically, TFT) will be described below.

[Step-100A]

First, a gate electrode 12 is formed on a base (which includes a glass substrate 10 and an insulating film 11 composed of $SiO_2$ disposed on the surface thereof). Specifically, a resist layer (not shown) is formed on the insulating film 11 using a lithographic technique, the resist layer having an opening corresponding to the portion at which the gate electrode 12 is to be formed. Next, a chromium (Cr) layer (not shown) as an adhesion layer and a gold (Au) layer as the gate electrode 12 are formed in that order by a vacuum deposition method over the entire surface, and then the resist layer is removed. Thereby, the gate electrode 12 can be obtained by a lift-off method.

[Step-110A]

Next, a gate insulating layer 13, a channel-forming region 14, and a channel-forming region extension 14A are formed on the base (specifically, the insulating film 11) including the gate electrode 12.

Specifically, a mixed solution including a polymeric insulating material (more specifically, PaMS) and the dioxaanthanthrene compound represented by structural formula (1) or structural formula (2) described above is prepared. The dioxaanthanthrene compound is more specifically 3,9-bis(p-ethylphenyl)-peri-xanthenoxanthene [PXX—(C2Ph)$_2$] represented by structural formula (9) below. Note that tetralin was used as a solvent. The mixing ratio of PaMS to PXX—(C2Ph)$_2$ was 1:1 (weight ratio).

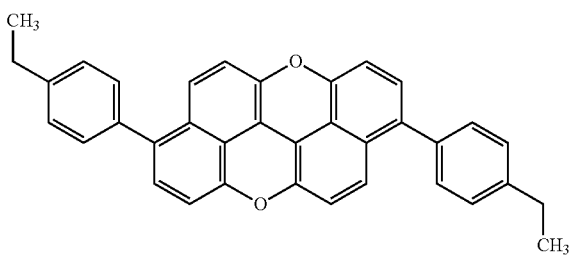

(9)

The mixed solution was applied by a spin coating method onto the gate electrode 12 and the insulating film 11 to form a thin film. Then, the thin film was dried at 120° C. for 30 minutes. The drying process was performed using a hot plate, in the air. During the drying process, phase separation of the polymeric insulating material and the dioxaanthanthrene compound represented by structural formula (9) occurred, and thereby a gate insulating layer 13 composed of the polymeric insulating material (PaMS) and a channel-forming region 14 and a channel-forming region extension 14A composed of the dioxaanthanthrene compound represented by structural formula (9) were obtained.

[Step-120A]

Then, source/drain electrodes 15 are formed on the channel-forming region extension 14A so as to sandwich the channel-forming region 14. Specifically, a chromium (Cr) layer (not shown) as an adhesion layer and gold (Au) layers as the source/drain electrodes 15 are formed in that order by a vacuum deposition method over the entire surface. Thereby, the structure shown in FIG. 1 can be obtained. In the process of forming the source/drain electrodes 15, by covering part of the channel-forming region extension 14A with a hard mask, the source/drain electrodes 15 can be formed without performing a photolithographic process.

[Step-130A]

Lastly, an insulating layer (not shown) which is a passivation film is formed over the entire surface, and openings are formed in the insulating layer on top of the source/drain electrodes 15. After a wiring material layer is formed over the entire surface including the inside of the openings, the wiring material layer is subjected to patterning. Thereby, a bottom gate/top contact type FET (TFT) in which interconnect lines (not shown) connected to the source/drain electrodes 15 are formed on the insulating layer can be obtained.

Furthermore, when Step-110A described above is treated as a step in the method of forming a multilayer semiconductor thin film, a mixed solution including (a) a first material composed of a polymeric insulating material (specifically, PaMS) and (b) a second material composed of a dioxaanthanthrene compound represented by structural formula (1) or structural formula (2) described above (specifically, structural formula (9)) is applied onto a substrate to form a thin film. Then, the thin film is dried to induce phase separation of the first material and the second material, thereby producing a stacked structure including a first layer composed of the first material (specifically, PaMS) and a second layer composed of the second material (specifically, the compound represented by structural formula (9)) disposed in that order from the substrate.

A sample was fabricated as an evaluation sample as described below. That is, a highly doped silicon semiconductor substrate was used as a gate electrode, and an insulating film composed of polyvinylphenol (PVP) was formed on the surface of the silicon semiconductor substrate. Then, by the same process as that in Step-110A, a gate insulating layer composed of a polymeric insulating material (PaMS) and a channel-forming region and a channel-forming region extension composed of the dioxaanthanthrene compound represented by structural formula (9) were formed on the insulating film. Then, as in Step-120A, source/drain electrodes were formed.

Figure 2:
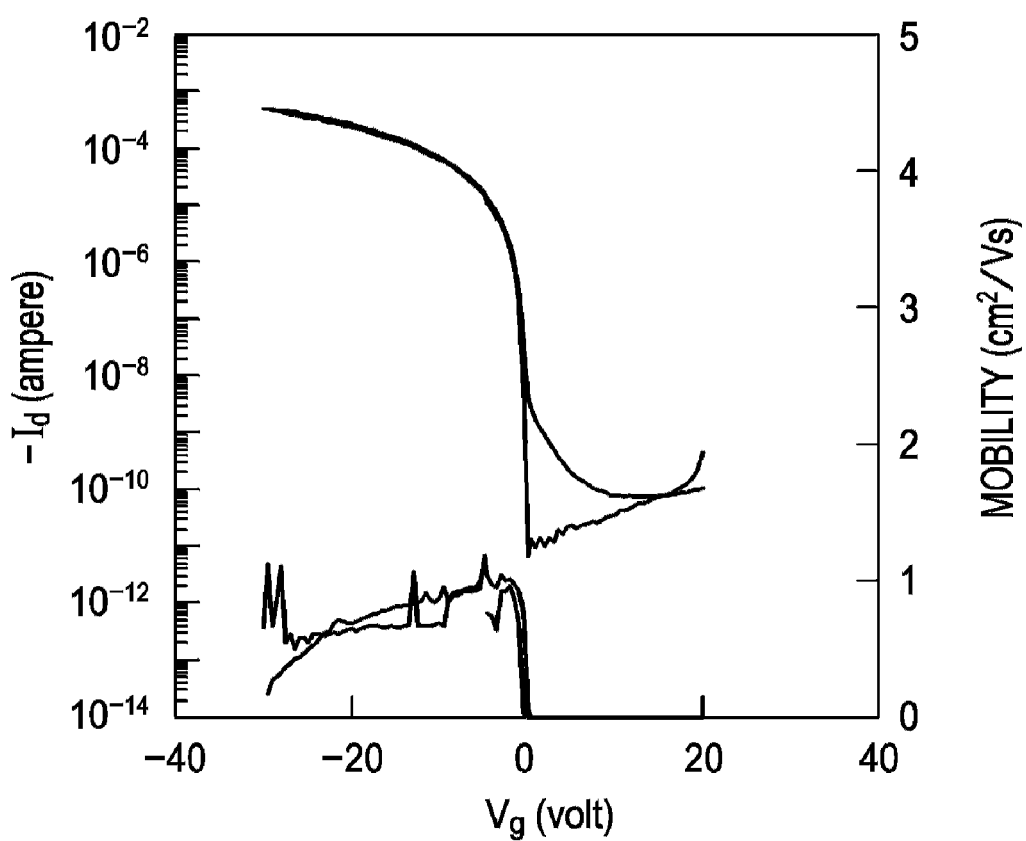
FIG. 2 is a graph showing the gate voltage dependence of the current-voltage curve (I-V characteristics) between source/drain electrodes in an evaluation sample in Example 1, the graph also showing the channel mobility.

The gate voltage dependence of the current-voltage curve between source/drain electrodes of the resulting sample was measured. The results thereof are shown in FIG. 2. As is evident from FIG. 2, current modulation occurs in response to the change in the gate electrode, thus confirming the characteristics of a transistor. Furthermore, as shown in FIG. 2, the mobility is 1 $cm^2/Vs$. The conditions are shown below.

Figure 3:
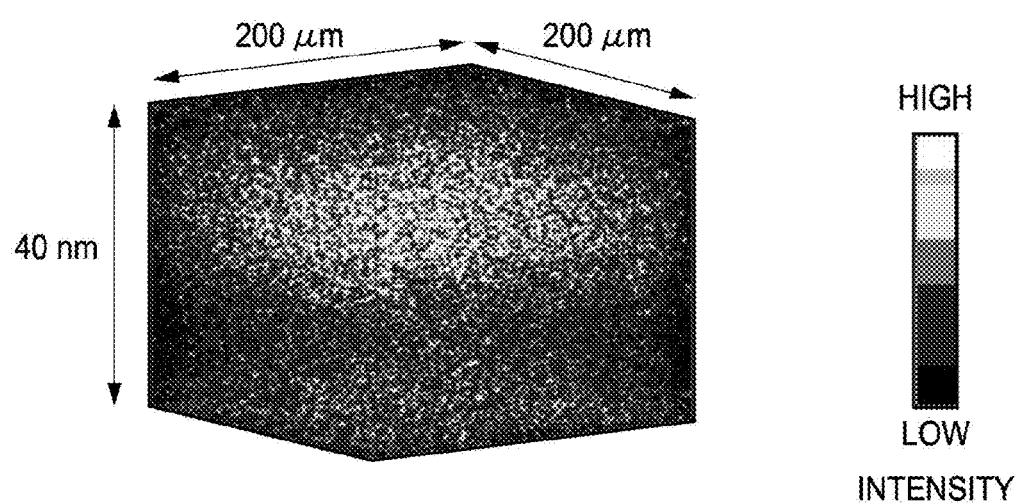
FIG. 3 is a diagram showing measurement results of the concentration profile in the depth direction by ToF-SIMS in combination with sputtering in the channel-forming region of a semiconductor device of Example 1.

Channel length (distance between source/drain electrodes): 200 μm
Channel width: 30 mm
Drain voltage: −30 V Furthermore, the concentration profile in the depth direction in the channel-forming region was measured by ToF-SIMS in combination with sputtering. The results thereof are shown in FIG. 3. As is evident from FIG. 3, the peak of oxygen contained in the dioxaanthanthrene compound is strongly detected in the vicinity of the surface. This confirms that phase separation of PXX—$(C2Ph)_2$ which is the organic semiconductor material and PaMS which is the polymeric insulating material occurs in Step-110A, and PXX—$(C2Ph)_2$ is highly concentrated on the upper side above the insulating film composed of PVP. Later analysis reveals that some amount of PXX—$(C2Ph)_2$ is mixed in the gate insulating layer which is in contact with the insulating film composed of PVP, and some amount of PaMS is mixed in the channel-forming region.

EXAMPLE 2

Example 2 is a modification of Example 1. In Example 2, as the dioxaanthanthrene compound, 3,9-bis(4-propylphenyl)-peri-xanthenoxanthene [PXX—$(C3Ph)_2$] represented by structural formula (11) of Example 12 described later, in which $R_3$ and $R_9$ are each an aryl-alkyl group, was used. Tetralin was used as the solvent. The mixing ratio of PaMS to PXX—$(C3Ph)_2$ was 1:1 (weight ratio).

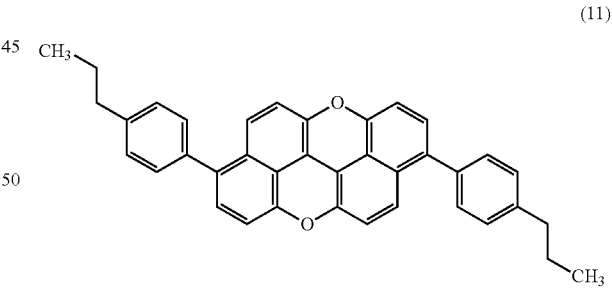

(11)

Figure 4:
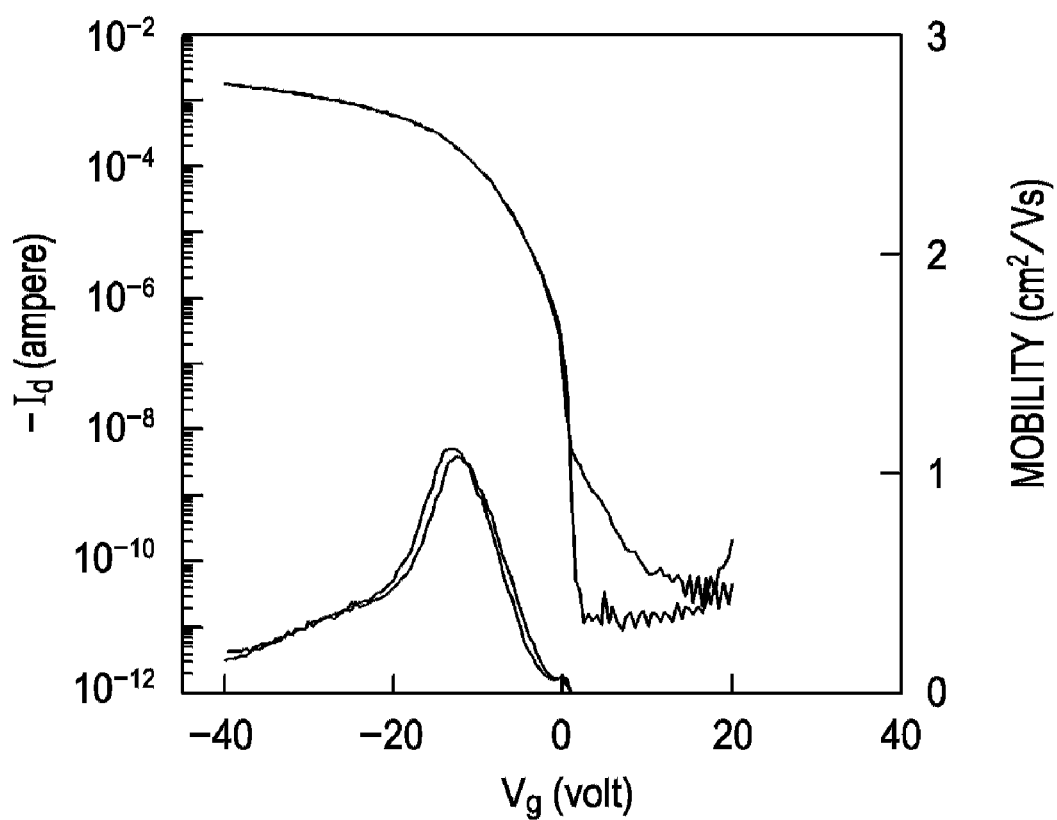
FIG. 4 is a graph showing the gate voltage dependence of the current-voltage curve (I-V characteristics) between source/drain electrodes in an evaluation sample in Example 2, the graph also showing the channel mobility.

As in Example 1, a semiconductor device was fabricated, and as in Example 1, an evaluation sample was fabricated. The gate voltage dependence of the current-voltage curve between source/drain electrodes of the resulting sample was measured. The results thereof are shown in FIG. 4. As is evident from FIG. 4, current modulation occurs in response to the change in the gate electrode, thus confirming the characteristics of a transistor. Furthermore, as shown in FIG. 4, the mobility is 1 $cm^2/Vs$. The conditions are shown below.

Channel length (distance between source/drain electrodes): 50 μm
Channel width: 30 mm
Drain voltage: −30 V

EXAMPLE 3

Example 3 is also a modification of Example 1. In Example 3, an evaluation sample was fabricated as in Example 1 except that a thermal oxide film ($SiO_2$ film with a thickness of 150 nm) was formed instead of forming an insulating film composed of PVP on the surface of the silicon semiconductor substrate.

Furthermore, as Comparative Example 3, an evaluation sample was fabricated in the same manner as that of Example 3 using a solution obtained by dissolving only PXX—$(C2Ph)_2$ in tetralin.

Figure 5:
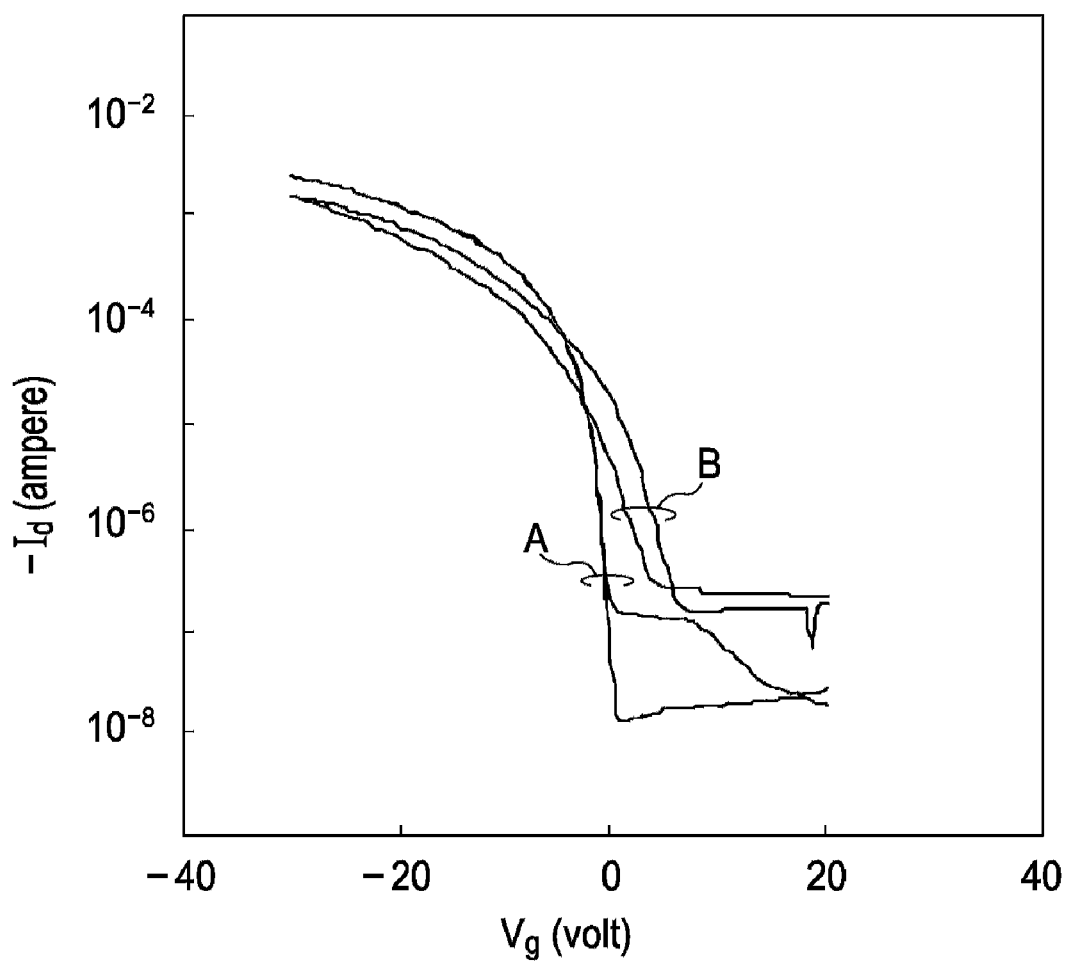
FIG. 5 is a graph showing the gate voltage dependence of the current-voltage curve (I-V characteristics) between source/drain electrodes in an evaluation sample in Example 3.

The gate voltage dependence of the current-voltage curve between source/drain electrodes of the resulting sample of each of Example 3 and Comparative Example 3 was measured. The results thereof are shown in FIG. 5. As is evident from FIG. 5, current modulation occurs in response to the change in the gate electrode, thus confirming the characteristics of a transistor. In FIG. 5, "A" indicates the results of Example 3 and "B" indicates the results of Comparative Example 3. In the sample of Example 3, $V_{to}$ (cut-off voltage in $I_d$-$V_{gs}$ characteristics) is closer to 0 volt compared with the sample of Comparative Example 3. Moreover, no hysteresis is exhibited and the on-current is high, which is superior to the results of Comparative Example 3. Furthermore, the measured mobilities were 0.7 $cm^2$/Vs in Example 3 and 0.3 $cm^2$/Vs in Comparative Example 3. The conditions are shown below.

Channel length (distance between source/drain electrodes): 50 μm
Channel width: 30 mm
Drain voltage: −30 V The other dioxaanthanthrene compounds suitable for use in the embodiments of the present invention will be described below in Examples 4 to 15. When semiconductor devices were fabricated as in Example 1 or 3 using the dioxaanthanthrene compounds of these examples, the same results as those of Example 1 or 3 were obtained.

EXAMPLE 4

Example 4 relates to dioxaanthanthrene compounds according to the first to fourth embodiments. A dioxaanthanthrene compound of Example 4 is an organic semiconductor material which is obtained by replacement with phenyl groups as aryl groups at both of positions 3 and 9 of 6,12-dioxaanthanthrene (PXX), i.e., 3,9-diphenyl-peri-xanthenoxanthene (PXX-$Ph_2$) represented by structural formula (3) below. That is, $R_3$ and $R_9$ are each an aryl group (specifically, phenyl group).

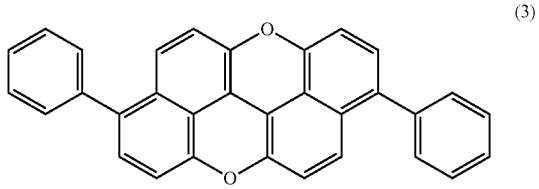 [SMILES: c1ccc(-c2ccc3oc4ccc5c(-c6ccccc6)ccc6oc7ccc2c3c7-c4c65)cc1]

(3)

Furthermore, a dioxaanthanthrene compound of Example 4 is 6,12-dioxaanthanthrene which is replaced at least one of positions 3 and 9 with a substituent, the dioxaanthanthrene compound being obtained by halogenating peri-xanthenoxanthene into 3,9-dihalo-peri-xanthenoxanthene and then replacing the halogen atom with the substituent. In this case, specifically, the halogen atom is bromine (Br). The substituent is an aryl group or aryl-alkyl group, or the substituent is an aryl group which is replaced at least one of positions 2 to 6 with an alkyl group or is an aryl group which is replaced at least one of positions 2 to 6 with an aryl group. The same applies to Examples 5 to 15 described later. In Example 4, specifically, the substituent is a phenyl group. Furthermore, a dioxaanthanthrene compound of Example 4 is 3,9-diphenyl-peri-xanthenoxanthene obtained by reacting peri-xanthenoxanthene with bromine to produce 3,9-dibromo-peri-xanthenoxanthene, and then by replacing bromine atoms with phenyl groups.

The PXX-$Ph_2$ which is the dioxaanthanthrene compound of Example 4 can be synthesized according to the scheme described below.

Figure 6:
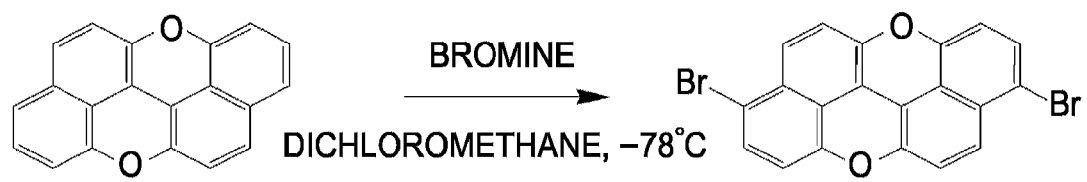
FIG. 6 is a diagram showing a synthesis scheme of dibromo-peri-xanthenoxanthene.

First, PXX—$Br_2$ which is a bromine substitution product of PXX is synthesized according to the scheme shown in FIG. 6. Specifically, a dichloromethane solution of bromine (2 equivalents) was reacted with a dichloromethane solution of PXX (1 equivalent) at −78° C. Then, the temperature of the reaction mixture was raised to room temperature, and the reaction mixture was treated with an aqueous solution of sodium bisulfite to give a yellow-green crude product. The crude product obtained by filtration was washed with dichloromethane, and thereby 3,9-dibromo-peri-xanthenoxanthene (PXX—$Br_2$) was obtained. It was confirmed by time-of-flight mass spectrometry (hereinafter abbreviated as "Tof-MS") and proton nuclear magnetic resonance spectroscopy ($^1$H-NMR) that this compound was a dibromonated product.

Next, a catalytic amount of tetrakistriphenylphosphine palladium (0) was added to a toluene solution of PXX—$Br_2$ (1 equivalent) and (4,4,5,5-tetramethyl-1,3,2-dioxaborolan-2-yl)benzene (2 equivalents) in the presence of sodium carbonate, and refluxing was performed for 48 hours. Then, the reaction mixture was left to stand to cool to room temperature and poured into methanol. The resulting precipitated yellow solid was obtained by filtration and washed with methanol, hydrochloric acid, and water. Then, recrystallization was performed from tetrahydrofuran, and thereby yellow needle crystals were obtained. It was confirmed by Tof-MS and $^1$H-NMR that the resulting compound was a disubstituted product, i.e., 3,9-diphenyl-peri-xanthenoxanthene (PXX-$Ph_2$).

Figure 7A:
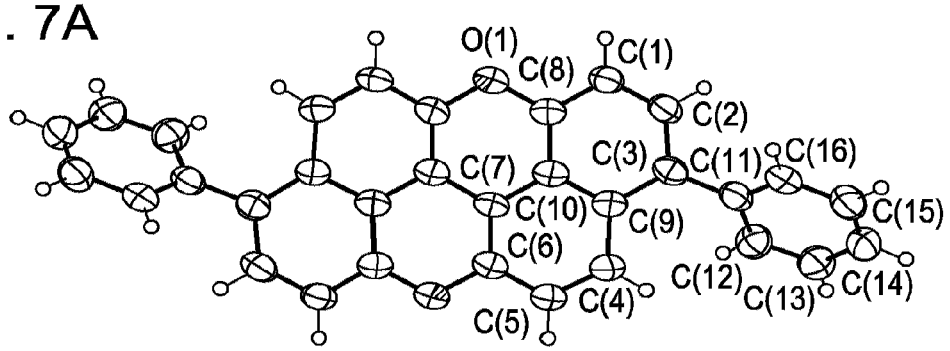
FIGS. 7A, 7B, and 7C are diagrams respectively showing a molecular structure, a crystal structure, and a stacking structure along the c-axis of 3,9-diphenyl-peri-xanthenoxanthene which is a dioxaanthanthrene compound in Example 4.
Figure 7B:
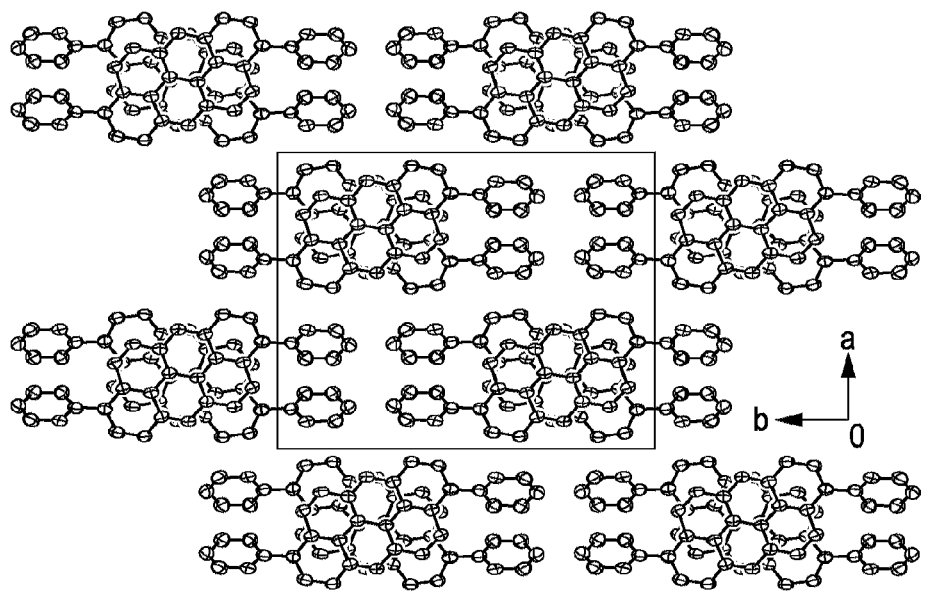
Figure 7C:
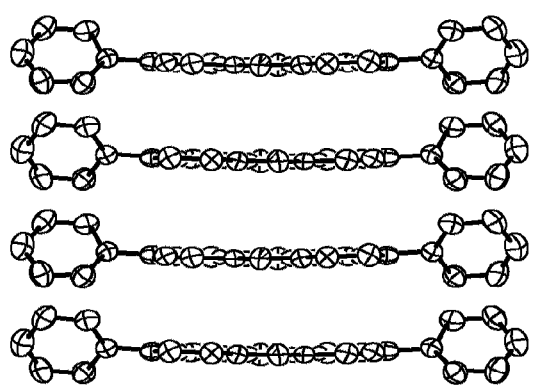

Using the resulting PXX-$Ph_2$ single crystal, X-ray structural analysis was carried out. The results thereof will be described below. FIG. 7A shows the molecular structure, which confirms that replacement with phenyl groups occurred at positions 3 and 9 of the PXX skeleton. Furthermore, FIG. 7B shows the crystal structure. Adjacent molecules are arranged along the c-axis such that pi-planes of PXX backbones are stacked in parallel (refer to FIG. 7C). The distance in the stacking direction between the molecular planes was 3.47 Å.

Crystal system: Orthorhombic system
Space group: Pccn (#56)
Lattice constant
 a=15.920(5) Å
 b=18.508(5) Å
 c=6.930(5) Å
V=2041.9(17) Å$^3$
Z=8

EXAMPLE 5

Example 5 relates to dioxaanthanthrene compounds according to the first and second embodiments of the present invention, and further relates to dioxaanthanthrene compounds according to the third and fifth embodiments. A dioxaanthanthrene compound of Example 5 is 3,9-di(trans-1-octen-1-yl)-peri-xanthenoxanthene [PXX—$(VC6)_2$] represented by structural formula (4) below. That is, $R_3$ and $R_9$ each include an alkenyl group (specifically, vinyl group) and an alkyl group.

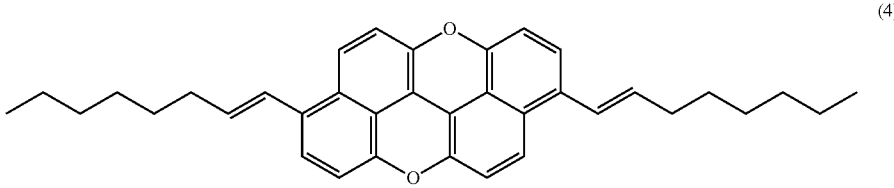 [SMILES: CCCCCC/C=C/c1ccc2oc3ccc4c(/C=C/CCCCCC)ccc5oc6ccc1c2c6-c3c54]

(4)

Furthermore, a dioxaanthanthrene compound of Example 5 is 3,9-di(trans-1-octen-1-yl)-peri-xanthenoxanthene obtained by reacting peri-xanthenoxanthene with bromine to produce 3,9-dibromo-peri-xanthenoxanthene, and then by replacing bromine atoms with trans-1-octen-1-yl groups.

PXX—(VC6)$_2$ of Example 5 was obtained according to the same scheme as that in Example 4, except that (4,4,5,5-tetramethyl-1,3,2-dioxaborolan-2-yl)benzene was changed to trans-1-octen-1-ylboronic acid pinacol ester in the synthesis process. Then, purification was performed by recrystallization from toluene. It was confirmed by Tof-MS and $^1$H-NMR that the resulting compound was a disubstituted product, i.e., PXX—(VC6)$_2$.

Figure 8A:
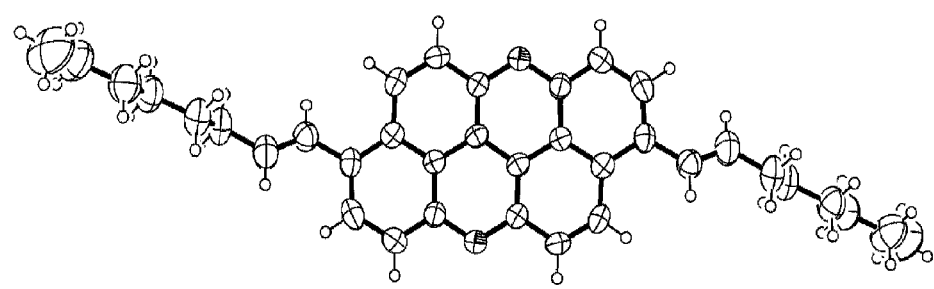
FIGS. 8A and 8B are diagrams respectively showing a molecular structure and a crystal structure of 3,9-di(trans-1-octen-1-yl)-peri-xanthenoxanthene which is a dioxaanthanthrene compound in Example 5.
Figure 8B:
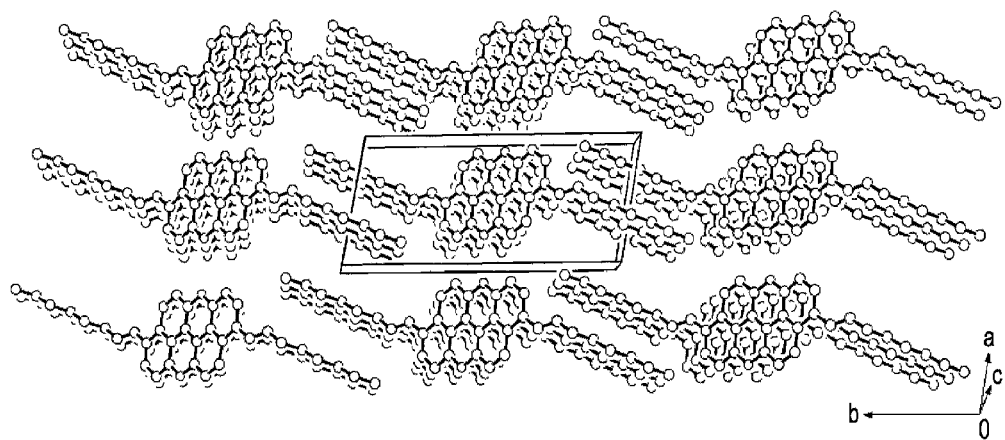
Figure 9:
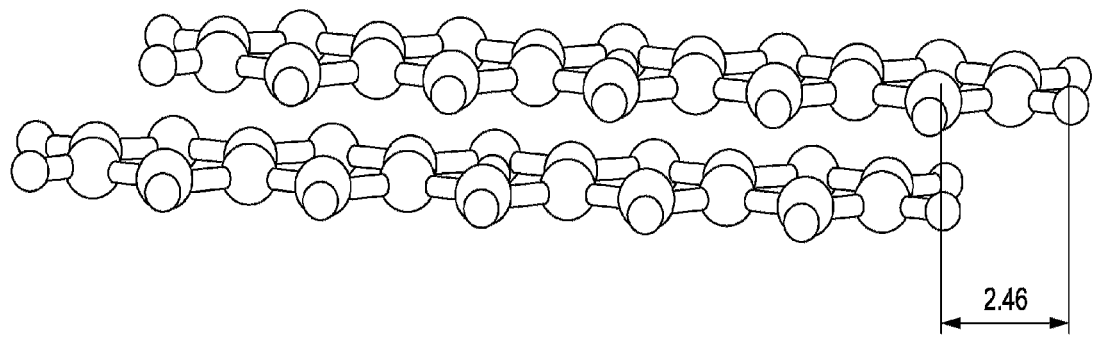
FIG. 9 is a diagram showing an example of packing in the pi-stacking arrangement.

Using the resulting PXX—(VC6)$_2$ single crystal, X-ray structural analysis was carried out. The results thereof will be described below. FIG. 8A shows the molecular structure, which confirms that replacement with trans-1-octen-1-yl groups occurred at positions 3 and 9 of the PXX skeleton. Furthermore, FIG. 8B shows the crystal structure. Adjacent molecules are arranged along the c-axis such that pi-planes of PXX backbones are stacked in parallel. In the crystal system shown below, the term "P-1" means the following:

P $\overline{1}$

Crystal system: Triclinic system
Space group: P-1 (#2)
Lattice constant
   a=8.279(2) Å
   b=18.015(5) Å
   c=4.9516(13) Å
   α=97.291(4) °
   β=103.559(4) °
   γ=98.867(4) °
V=699.0(3) Å$^3$
Z=1

EXAMPLE 6

Example 6 also relates to dioxaanthanthrene compounds according to the first and second embodiments of the present invention, and further relates to dioxaanthanthrene compounds according to the third and sixth embodiments. A dioxaanthanthrene compound of Example 6 is 3,9-di(2-naphthyl)-peri-xanthenoxanthene [PXX-(Nap)$_2$] represented by structural formula (5) below. That is, R$_3$ and R$_9$ are each an aryl group (specifically, β-naphthyl group).

(5)

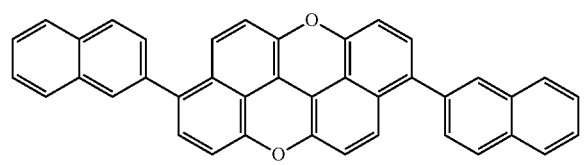

Furthermore, a dioxaanthanthrene compound of Example 6 is 3,9-di(2-naphthyl)-peri-xanthenoxanthene obtained by reacting peri-xanthenoxanthene with bromine to produce 3,9-dibromo-peri-xanthenoxanthene, and then by replacing bromine atoms with β-naphthyl groups.

PXX-(Nap)$_2$ of Example 6 was obtained according to the same scheme as that in Example 4, except that (4,4,5,5-tetramethyl-1,3,2-dioxaborolan-2-yl)benzene was changed to naphthalene-2-boronic acid pinacol ester in the synthesis process. Then, purification was performed by extraction using tetrahydrofuran. It was confirmed by Tof-MS and $^1$H-NMR that the resulting compound was a disubstituted product, i.e., PXX-(Nap)$_2$.

EXAMPLE 7

Example 7 also relates to dioxaanthanthrene compounds according to the first and second embodiments of the present invention, and further relates to dioxaanthanthrene compounds according to the third and seventh embodiments. A dioxaanthanthrene compound of Example 7 is 3,9-bis(2,2'-bithiophen-5-yl)-peri-xanthenoxanthene [PXX—(BT)$_2$] represented by structural formula (6) below. That is, R$_3$ and R$_9$ are each an aromatic heterocycle (specifically, 2,2'-bithiophen-5-yl group).

(6)

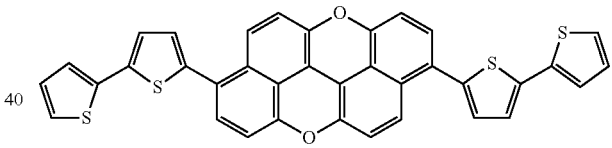

Furthermore, a dioxaanthanthrene compound of Example 7 is 3,9-bis(2,2'-bithiophen-5-yl)-peri-xanthenoxanthene obtained by reacting peri-xanthenoxanthene with bromine to produce 3,9-dibromo-peri-xanthenoxanthene, and then by replacing bromine atoms with 2,2'-bithiophen-5-yl groups.

PXX—(BT)$_2$ of Example 7 was obtained according to the same scheme as that in Example 4, except that (4,4,5,5-tetramethyl-1,3,2-dioxaborolan-2-yl)benzene was changed to 2,2'-bithiophene-5-boronic acid pinacol ester in the synthesis process. Then, purification was performed by extraction using tetrahydrofuran. It was confirmed by Tof-MS and $^1$H-NMR that the resulting compound was a disubstituted product, i.e., PXX—(BT)$_2$.

EXAMPLE 8

Example 8 also relates to dioxaanthanthrene compounds according to the first and second embodiments of the present invention, and further relates to dioxaanthanthrene compounds according to the third and eighth embodiments. A dioxaanthanthrene compound of Example 8 is 3,9-bis(trans-2-(4-pentylphenyl)vinyl)-peri-xanthenoxanthene [PXX—(VPC5)$_2$] represented by structural formula (7) below. That is, R$_3$ and R$_9$ each include a vinyl group, a phenyl group, and an alkyl group.

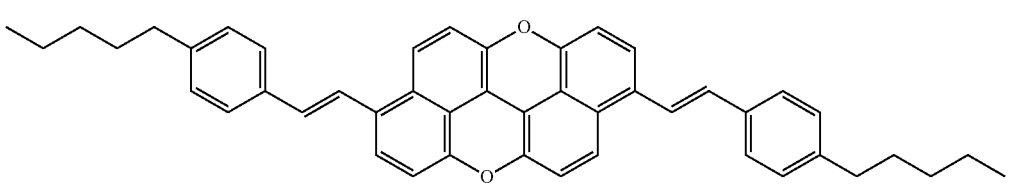

(7)

Furthermore, a dioxaanthanthrene compound of Example 8 is 3,9-bis(trans-2-(4-pentylphenyl)vinyl)-peri-xanthenoxanthene obtained by reacting peri-xanthenoxanthene with bromine to produce 3,9-dibromo-peri-xanthenoxanthene, and then by replacing bromine atoms with trans-2-(4-pentylphenyl)vinyl groups.

PXX—(VPC5)$_2$ of Example 8 was obtained according to the same scheme as that in Example 4, except that (4,4,5,5-tetramethyl-1,3,2-dioxaborolan-2-yl)benzene was changed to 2-[2-(4-pentylphenyl)vinyl]-4,4,5,5-tetramethyl-1,3,2-dioxaborane in the synthesis process. Then, purification was performed by extraction using tetrahydrofuran. It was confirmed by Tof-MS and $^1$H-NMR that the resulting compound was a disubstituted product, i.e., PXX—(VPC5)$_2$.

EXAMPLE 9

Example 9 also relates to dioxaanthanthrene compounds according to the first and second embodiments of the present invention, and further relates to dioxaanthanthrene compounds according to the third and ninth embodiments. A dioxaanthanthrene compound of Example 9 is 3,9-di(p-tolyl)-peri-xanthenoxanthene [PXX—(C1Ph)$_2$] represented by structural formula (8) below. That is, R$_3$ and R$_9$ are each an aryl-alkyl group (aryl group partially substituted by an alkyl group; hereinafter, the same).

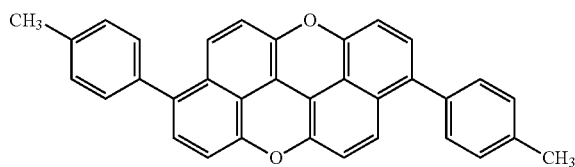

(8)

Furthermore, a dioxaanthanthrene compound of Example 9 is 3,9-di(p-tolyl)-peri-xanthenoxanthene obtained by reacting peri-xanthenoxanthene with bromine to produce 3,9-dibromo-peri-xanthenoxanthene, and then by replacing bromine atoms with p-tolyl groups.

PXX—(C1Ph)$_2$ of Example 9 was obtained according to the same scheme as that in Example 4, except that (4,4,5,5-tetramethyl-1,3,2-dioxaborolan-2-yl)benzene was changed to p-tolylboronic acid in the synthesis process. Then, purification was performed by sublimation under high vacuum, followed by extraction using tetrahydrofuran. It was confirmed by Tof-MS and $^1$H-NMR that the resulting compound was a disubstituted product, i.e., PXX—(C1Ph)$_2$.

EXAMPLE 10

Example 10 also relates to dioxaanthanthrene compounds according to the first and second embodiments of the present invention, and further relates to dioxaanthanthrene compounds according to the third and tenth embodiments. A dioxaanthanthrene compound of Example 10 is 3,9-bis(p-ethylphenyl)-peri-xanthenoxanthene [PXX—(C2Ph)$_2$] represented by structural formula (9) below. That is, R$_3$ and R$_9$ are each an aryl-alkyl group.

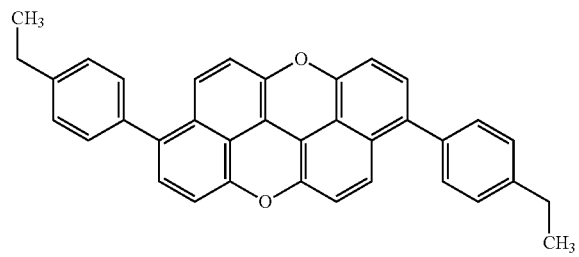

(9)

Furthermore, a dioxaanthanthrene compound of Example 10 is 3,9-bis(p-ethylphenyl)-peri-xanthenoxanthene obtained by reacting peri-xanthenoxanthene with bromine to produce 3,9-dibromo-peri-xanthenoxanthene, and then by replacing bromine atoms with p-ethylphenyl groups.

PXX—(C2Ph)$_2$ of Example 10 was obtained according to the same scheme as that in Example 4, except that (4,4,5,5-tetramethyl-1,3,2-dioxaborolan-2-yl)benzene was changed to p-ethylphenylboronic acid in the synthesis process. Then, purification was performed by sublimation under high vacuum, followed by recrystallization using toluene. It was confirmed by Tof-MS and $^1$H-NMR that the resulting compound was a disubstituted product, i.e., PXX—(C2Ph)$_2$.

EXAMPLE 11

Example 11 also relates to dioxaanthanthrene compounds according to the first and second embodiments of the present invention, and further relates to dioxaanthanthrene compounds according to the third and eleventh embodiments. A dioxaanthanthrene compound of Example 11 is 3,9-bis(p-isopropylphenyl)-peri-xanthenoxanthene [PXX-(iC3Ph)$_2$] represented by structural formula (10) below. That is, R$_3$ and R$_9$ are each an aryl-alkyl group.

(10)

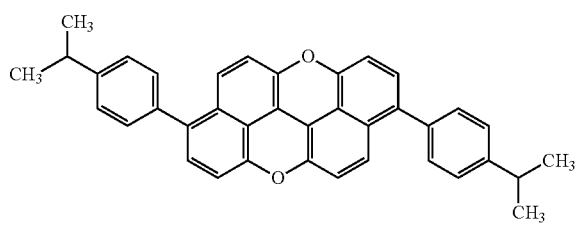

Furthermore, a dioxaanthanthrene compound of Example 11 is 3,9-bis(p-isopropylphenyl)-peri-xanthenoxanthene obtained by reacting peri-xanthenoxanthene with bromine to produce 3,9-dibromo-peri-xanthenoxanthene, and then by replacing bromine atoms with p-isopropylphenyl groups.

PXX-(iC3Ph)$_2$ of Example 11 was obtained according to the same scheme as that in Example 4, except that (4,4,5,5-tetramethyl-1,3,2-dioxaborolan-2-yl)benzene was changed to p-isopropylphenylboronic acid in the synthesis process. Then, purification was performed by sublimation under high vacuum, followed by recrystallization using toluene. It was confirmed by Tof-MS and $^1$H-NMR that the resulting compound was a disubstituted product, i.e., PXX-(iC3Ph)$_2$.

EXAMPLE 12

Example 12 also relates to dioxaanthanthrene compounds according to the first and second embodiments of the present invention, and further relates to dioxaanthanthrene compounds according to the third and twelfth embodiments. A dioxaanthanthrene compound of Example 12 is 3,9-bis(4-propylphenyl)-peri-xanthenoxanthene [PXX—(C3Ph)$_2$] represented by structural formula (11) below. That is, $R_3$ and $R_9$ are each an aryl-alkyl group.

(11)

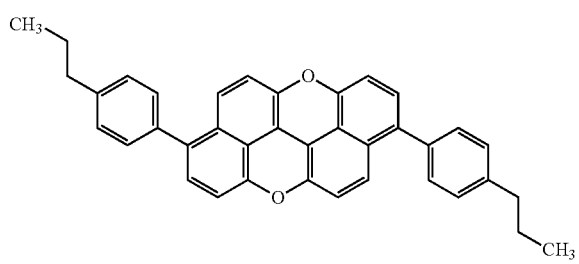

Furthermore, a dioxaanthanthrene compound of Example 12 is 3,9-bis(4-propylphenyl)-peri-xanthenoxanthene obtained by reacting peri-xanthenoxanthene with bromine to produce 3,9-dibromo-peri-xanthenoxanthene, and then by replacing bromine atoms with 4-propylphenyl groups.

PXX—(C3Ph)$_2$ of Example 12 was obtained according to the same scheme as that in Example 4, except that (4,4,5,5-tetramethyl-1,3,2-dioxaborolan-2-yl)benzene was changed to 4-propylphenylboronic acid in the synthesis process. Then, purification was performed by sublimation under high vacuum, followed by recrystallization using toluene. It was confirmed by Tof-MS and $^1$H-NMR that the resulting compound was a disubstituted product, i.e., PXX—(C3Ph)$_2$.

EXAMPLE 13

Example 13 also relates to dioxaanthanthrene compounds according to the first and second embodiments of the present invention, and further relates to dioxaanthanthrene compounds according to the third and thirteenth embodiments. A dioxaanthanthrene compound of Example 13 is 3,9-bis(4-butylphenyl)-peri-xanthenoxanthene [PXX—(C4Ph)$_2$] represented by structural formula (12) below. That is, $R_3$ and $R_9$ are each an aryl-alkyl group.

(12)

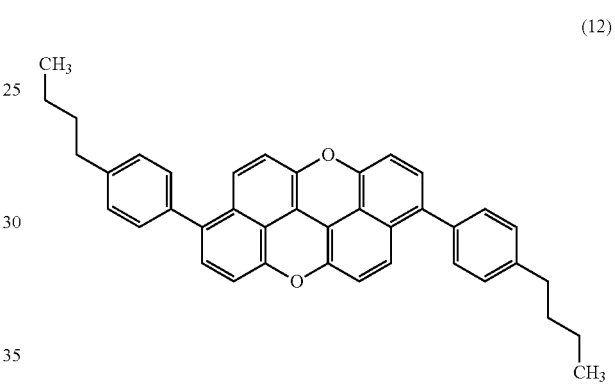

Furthermore, a dioxaanthanthrene compound of Example 13 is 3,9-bis(4-butylphenyl)-peri-xanthenoxanthene obtained by reacting peri-xanthenoxanthene with bromine to produce 3,9-dibromo-peri-xanthenoxanthene, and then by replacing bromine atoms with 4-butylphenyl groups.

PXX—(C4Ph)$_2$ of Example 13 was obtained according to the same scheme as that in Example 4, except that (4,4,5,5-tetramethyl-1,3,2-dioxaborolan-2-yl)benzene was changed to 4-butylphenylboronic acid in the synthesis process. Then, purification was performed by sublimation under high vacuum, followed by recrystallization using toluene. It was confirmed by Tof-MS and $^1$H-NMR that the resulting compound was a disubstituted product, i.e., PXX—(C4Ph)$_2$.

EXAMPLE 14

Example 14 also relates to dioxaanthanthrene compounds according to the first and second embodiments of the present invention, and further relates to dioxaanthanthrene compounds according to the third and fourteenth embodiments. A dioxaanthanthrene compound of Example 14 is 3,9-bis(4-nonylphenyl)-peri-xanthenoxanthene [PXX—(C9Ph)$_2$] represented by structural formula (13) below. That is, $R_3$ and $R_9$ are each an aryl-alkyl group.

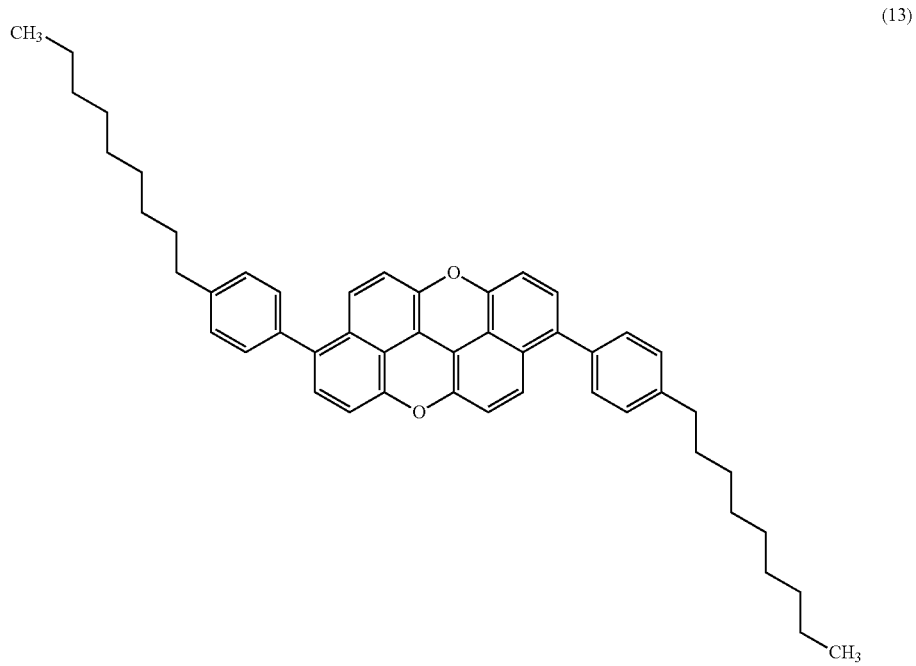 [SMILES: CCCCCCCCCc1ccc(-c2ccc3oc4ccc5c(-c6ccc(CCCCCCCCC)cc6)ccc6oc7ccc2c3c7-c4c65)cc1]

(13)

Furthermore, a dioxaanthanthrene compound of Example 14 is 3,9-bis(4-nonylphenyl)-peri-xanthenoxanthene obtained by reacting peri-xanthenoxanthene with bromine to produce 3,9-dibromo-peri-xanthenoxanthene, and then by replacing bromine atoms with 4-nonylphenyl groups.

PXX—(C9Ph)$_2$ of Example 14 was obtained according to the same scheme as that in Example 4, except that (4,4,5,5-tetramethyl-1,3,2-dioxaborolan-2-yl)benzene was changed to 4-normal-nonylbenzene boronic acid in the synthesis process. Then, purification was performed by sublimation under high vacuum, followed by recrystallization using toluene. It was confirmed by Tof-MS that the resulting compound was a disubstituted product, i.e., PXX—(C9Ph)$_2$.

EXAMPLE 15

Example 15 also relates to dioxaanthanthrene compounds according to the first and second embodiments of the present invention, and further relates to dioxaanthanthrene compounds according to the third and fifteenth embodiments. A dioxaanthanthrene compound of Example 15 is 3,9-bis(p-biphenyl)-peri-xanthenoxanthene [PXX—(BPh)$_2$] represented by structural formula (14) below. That is, R$_3$ and R$_9$ are each an aryl group.

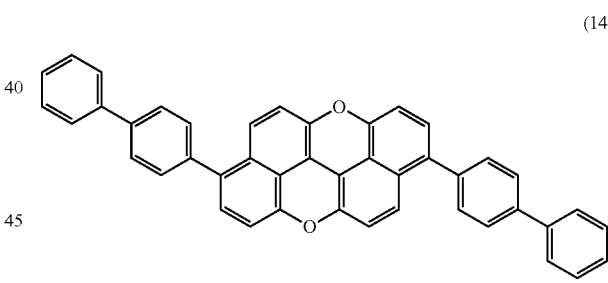

(14)

Furthermore, a dioxaanthanthrene compound of Example 15 is 3,9-bis(p-biphenyl)-peri-xanthenoxanthene obtained by reacting peri-xanthenoxanthene with bromine to produce 3,9-dibromo-peri-xanthenoxanthene, and then by replacing bromine atoms with p-biphenyl groups.

PXX—(BPh)$_2$ of Example 15 was obtained according to the same scheme as that in Example 4, except that (4,4,5,5-tetramethyl-1,3,2-dioxaborolan-2-yl)benzene was changed to 4-biphenylboronic acid in the synthesis process. Then, purification was performed by sublimation under high vacuum, followed by extraction using benzene. It was confirmed by Tof-MS that the resulting compound was a disubstituted product, i.e., PXX—(BPh)$_2$.

The present invention has been described on the basis of the preferred Examples. However, the present invention is not limited to these Examples. The configurations and structures of the semiconductor devices, the fabrication conditions, and the fabrication methods described above are merely exemplification, and can be altered appropriately. When the semiconductor devices according to the embodiments of the present invention are applied to or used for display devices or various types of electronic apparatuses, monolithic integrated circuits in which many FETs are integrated on supports or supporting members may be fabricated, or the individual FETs may be separated by cutting to produce discrete components.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device including a gate electrode, a gate insulating layer, source/drain electrodes, and a channel-forming region that are disposed on a base, the method comprising the steps of:
   forming a thin film by application of a mixed solution including a polymeric insulating material and a dioxaanthanthrene compound represented by structural formula (1) below; and
   subsequently drying the thin film to induce phase separation of the polymeric insulating material and the dioxaanthanthrene compound represented by structural formula (1) below, thereby forming the gate insulating layer from the polymeric insulating material and the channel-forming region from the dioxaanthanthrene compound represented by structural formula (1) below:

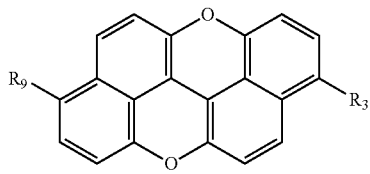

(1)

wherein at least one of $R_3$ and $R_9$ represents a substituent other than hydrogen.

2. The method of manufacturing a semiconductor device according to claim 1, wherein phase separation of the polymeric insulating material and the dioxaanthanthrene compound represented by structural formula (1) is induced by adjusting the molecular weight of the polymeric insulating material.

3. The method of manufacturing a semiconductor device according to claim 1, wherein the Gibbs energy of mixing of a mixing system of the polymeric insulating material and the dioxaanthanthrene compound represented by structural formula (1) constituting the mixed solution has a positive value.

4. The method of manufacturing a semiconductor device according to claim 1, wherein the polymeric insulating material is composed of PaMS.

5. The method of manufacturing a semiconductor device according to claim 1, wherein the substituent other than hydrogen is a substituent selected from the group consisting of an alkyl group, a cycloalkyl group, an alkenyl group, an alkynyl group, an aryl group, an aryl-alkyl group, an aromatic heterocycle, a heterocyclic group, an alkoxy group, a cycloalkoxy group, an aryloxy group, an alkylthio group, a cycloalkylthio group, an arylthio group, an alkoxycarbonyl group, an aryloxycarbonyl group, a sulfamoyl group, an acyl group, an acyloxy group, an amide group, a carbamoyl group, a ureido group, a sulfinyl group, an alkylsulfonyl group, an arylsulfonyl group, an amino group, a halogen atom, a fluorohydrocarbon group, a cyano group, a nitro group, a hydroxy group, a mercapto group, and a silyl group.

6. The method of manufacturing a semiconductor device according to claim 1, wherein the substituent other than hydrogen is a substituent selected from the group consisting of an alkyl group, an alkenyl group, an aryl group, an aryl-alkyl group, an aromatic heterocycle, and a halogen atom.

7. A method of manufacturing a semiconductor device including a gate electrode, a gate insulating layer, source/drain electrodes, and a channel-forming region that are disposed on a base, the method comprising the steps of:
   forming a thin film by application of a mixed solution including a polymeric insulating material and a dioxaanthanthrene compound represented by structural formula (2) below; and
   subsequently drying the thin film to induce phase separation of the polymeric insulating material and the dioxaanthanthrene compound represented by structural formula (2) below, thereby forming the gate insulating layer from the polymeric insulating material and the channel-forming region from the dioxaanthanthrene compound represented by structural formula (2) below:

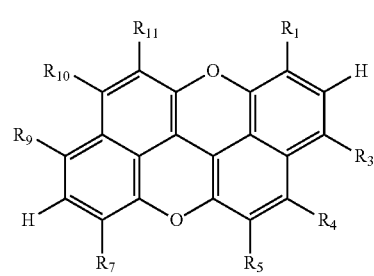

(2)

wherein at least one of $R_1$, $R_3$, $R_4$, $R_5$, $R_7$, $R_9$, $R_{10}$, and $R_{11}$ represents a substituent other than hydrogen.

8. The method of manufacturing a semiconductor device according to claim 7, wherein phase separation of the polymeric insulating material and the dioxaanthanthrene compound represented by structural formula (2) is induced by adjusting the molecular weight of the polymeric insulating material.

9. The method of manufacturing a semiconductor device according to claim 7, wherein the Gibbs energy of mixing of a mixing system of the polymeric insulating material and the dioxaanthanthrene compound represented by structural formula (2) constituting the mixed solution has a positive value.

10. The method of manufacturing a semiconductor device according to claim 7, wherein the polymeric insulating material is composed of PaMS.

11. The method of manufacturing a semiconductor device according to claim 7, wherein at least one of $R_3$ and $R_9$ represents a substituent other than hydrogen; and
   at least one of $R_1$, $R_4$, $R_5$, $R_7$, $R_{10}$, and $R_{11}$ represents a substituent other than hydrogen.

12. The method of manufacturing a semiconductor device according to claim 7, wherein the substituent other than hydrogen is a substituent selected from the group consisting of an alkyl group, a cycloalkyl group, an alkenyl group, an alkynyl group, an aryl group, an aryl-alkyl group, an aromatic heterocycle, a heterocyclic group, an alkoxy group, a cycloalkoxy group, an aryloxy group, an alkylthio group, a cycloalkylthio group, an arylthio group, an alkoxycarbonyl group, an aryloxycarbonyl group, a sulfamoyl group, an acyl group, an acyloxy group, an amide group, a carbamoyl group, a ureido group, a sulfinyl group, an alkylsulfonyl group, an arylsulfonyl group, an amino group, a halogen atom, a fluorohydrocarbon group, a cyano group, a nitro group, a hydroxy group, a mercapto group, and a silyl group.

13. The method of manufacturing a semiconductor device according to claim 7, wherein the substituent other than hydrogen is a substituent selected from the group consisting of an alkyl group, an alkenyl group, an aryl group, an arylalkyl group, an aromatic heterocycle, and a halogen atom.

14. A method of forming a multilayer semiconductor thin film comprising the steps of:
   forming a thin film by applying a mixed solution including (a) a first material composed of a polymeric insulating material and (b) a second material composed of a dioxaanthanthrene compound represented by structural formula (1) below onto a substrate; and
   subsequently drying the thin film to induce phase separation of the first material and the second material, thereby producing a stacked structure including a first layer composed of the first material and a second layer composed of the second material:

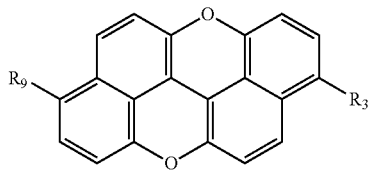

(1)

wherein at least one of $R_3$ and $R_9$ represents a substituent other than hydrogen.

15. A method of forming a multilayer semiconductor thin film comprising the steps of:
   forming a thin film by applying a mixed solution including (a) a first material composed of a polymeric insulating material and (b) a second material composed of a dioxaanthanthrene compound represented by structural formula (2) below onto a substrate; and
   subsequently drying the thin film to induce phase separation of the first material and the second material, thereby producing a stacked structure including a first layer composed of the first material and a second layer composed of the second material:

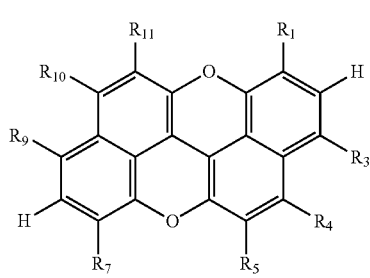

(2)

wherein at least one of $R_1$, $R_3$, $R_4$, $R_5$, $R_7$, $R_9$, $R_{10}$, and $R_{11}$ represents a substituent other than hydrogen.

* * * * *